US008006161B2

(12) United States Patent
Lestable et al.

(10) Patent No.: US 8,006,161 B2
(45) Date of Patent: Aug. 23, 2011

(54) APPARATUS AND METHOD FOR RECEIVING SIGNAL IN A COMMUNICATION SYSTEM USING A LOW DENSITY PARITY CHECK CODE

(75) Inventors: Thierry Lestable, Stains (GB); Sung-Eun Park, Seoul (KR)

(73) Assignee: Samsung Electronics Co., Ltd (KR)

( * ) Notice: Subject to any disclaimer, the term of this patent is extended or adjusted under 35 U.S.C. 154(b) by 1330 days.

(21) Appl. No.: 11/586,759

(22) Filed: Oct. 26, 2006

(65) Prior Publication Data
US 2007/0168833 A1    Jul. 19, 2007

(30) Foreign Application Priority Data

Oct. 26, 2005 (GB) .................................. 0521858.1
Oct. 26, 2005 (GB) .................................. 0521859.9
Oct. 26, 2005 (GB) .................................. 0521860.7
Oct. 26, 2005 (GB) .................................. 0521861.5

(51) Int. Cl.
*H03M 13/00* (2006.01)
(52) U.S. Cl. ......... 714/755; 714/786; 714/758; 702/189
(58) Field of Classification Search .................. 714/755, 714/786, 794–795, 758; 375/341, 262; 702/189
See application file for complete search history.

(56) References Cited

U.S. PATENT DOCUMENTS

| 6,510,536 | B1 * | 1/2003 | Crozier et al. ................. 714/755 |
| 6,704,898 | B1 * | 3/2004 | Furuskar et al. .............. 714/751 |
| 7,246,294 | B2 * | 7/2007 | Kauschke et al. ............. 714/755 |
| 2004/0123229 | A1 | 6/2004 | Kim et al. |
| 2005/0028071 | A1 | 2/2005 | Shen et al. |
| 2005/0138519 | A1 | 6/2005 | Boutillon et al. |
| 2005/0154957 | A1 | 7/2005 | Jacobsen |
| 2005/0204271 | A1 | 9/2005 | Sharon et al. |
| 2005/0210366 | A1 | 9/2005 | Maehata |
| 2005/0229087 | A1 | 10/2005 | Kim et al. |
| 2007/0101234 | A1 * | 5/2007 | Shokrollahi .................. 714/758 |

FOREIGN PATENT DOCUMENTS

| JP | 2005-269535 | 9/2005 |
| KR | 1020040057871 | 7/2004 |

OTHER PUBLICATIONS

Guilloud et al., "Min Decoding Algorithm of Regular and Irregular LDPC Codes".
Richardson et al., "The Renaissance of Gallager's Low-Density Parity-Check Codes", IEEE Communications Magazine, Aug. 2003, pp. 126-131.
Kschischang et al., "Codes Defined on Graphs", IEEE Communications Magazine, Aug. 2003, pp. 118-125.
Yeo et al., "Iterative Decoder Architectures", IEEE Communications Magazine, Aug. 2003, pp. 132-140.

(Continued)

*Primary Examiner* — Guy J Lamarre
(74) *Attorney, Agent, or Firm* — The Farrell Law Firm, P.C.

(57) ABSTRACT

An apparatus and a method for receiving a signal in a communication system using a Low Density Parity Check (LDPC) code. The apparatus and the method includes decoding a received signal according to a hybrid decoding scheme, wherein the hybrid decoding scheme is generated by combining two of a first decoding scheme, a second decoding scheme, and a third decoding scheme.

18 Claims, 13 Drawing Sheets

OTHER PUBLICATIONS

Dholakia et al., "Capacity-Approaching Codes: Can They Be Applied to the Magnetic Recording Channel?", IEEE Communications Magazine, Feb. 2004, pp. 122-130.

Chen et al., "Decoding Low-Density Parity Check Codes with Normalized APP-Based Algorithm", IEEE Communications Magazine, 2001, pp. 1026-1030.

* cited by examiner ns and method for receiving signals in a communication system, and in particular, to an apparatus and method for receiving signals in a communication system using Low Density Parity Check (LDPC) codes.

APPARATUS AND METHOD FOR RECEIVING SIGNAL IN A COMMUNICATION SYSTEM USING A LOW DENSITY PARITY CHECK CODE

PRIORITY

This application claims the benefit under 35 U.S.C. §119(a) of an application filed in the United Kingdom Patent Office on Oct. 26, 2005 and assigned Serial No. 0521859.9, an application filed in the United Kingdom Patent Office on Oct. 26, 2005 and assigned Serial No. 0521858.1, an application filed in the United Kingdom Patent Office on Oct. 26, 2005 and assigned Serial No. 0521860.7, and an application filed in the United Kingdom Patent Office on Oct. 26, 2005 and assigned Serial No. 0521861.5, the contents of all of which are incorporated herein by reference.

BACKGROUND OF THE INVENTION

1. Field of the Invention

The present invention relates generally to an apparatus and method for receiving signals in a communication system, and in particular, to an apparatus and method for receiving signals in a communication system using Low Density Parity Check (LDPC) codes.

2. Description of the Related Art

Due to the rapid development of mobile communication systems, there is a need for technology capable of transmitting bulk data approximating the capacity of a wire network even in a wireless network. To meet the increasing demand for a high-speed, high-capacity communication system capable of processing and transmitting various data such as video and wireless data beyond the voice-oriented service, it is essential to increase system transmission efficiency using an appropriate channel coding scheme in order to improve the system performance. However, due to the characteristics of the mobile communication system, it inevitably incurs error during data transmission due to noises, interference and fading according to channel conditions. The error causes a loss of information data.

Accordingly, various error control schemes are used according to channel characteristics in order to improve reliability of the mobile communication system. The most typical error control scheme uses error correction codes.

It is well known that the LDPC code is superior in performance gain to a convolutional code conventionally used for error correction, during high-speed data transmission. The LDPC code is advantageous in that it can efficiently correct an error caused by noises generated in a transmission channel, thereby increasing reliability of the data transmission. In addition, the LDPC code can be decoded using an iterative decoding algorithm base on a sum-product algorithm in a factor graph. Because a decoder for the LDPC code uses the sum-product algorithm-based iterative decoding algorithm, it is less complex than a decoder for the turbo code. In addition, the decoder for the LDPC code is easy to implement with a parallel processing decoder, as compared with the decoder for the turbo code.

The turbo code has good performance approximating a channel capacity limit of Shannon's channel coding theorem, and the LDPC code shows performance having a difference of only about 0.04 [dB] at the channel capacity limit of Shannon's channel coding theorem at a bit error rate (BER) $10^{-5}$, using a block size $10^7$. Shannon's channel coding theorem shows that reliable communication is possible only at a data rate not exceeding a channel capacity. However, Shannon's channel coding theorem has proposed no detailed channel coding/decoding method for supporting a data rate up to the maximum channel capacity limit. Generally, although a random code having a very large block size shows performance approximating the channel capacity limit of Shannon's channel coding theorem, when a MAP (Maximum A Posteriori) or ML (Maximum Likelihood) decoding method is used, it is impossible to implement the decoding method because of its heavy calculation load.

Meanwhile, if the LDPC code is expressed with a factor graph, cycles exist in the factor graph, and it is well known that iterative decoding in the factor graph of the LDPC code where cycles exist is not preferred. Also, it has been experimentally proven that the LDPC code has excellent performance through iterative decoding. However, when there are too many short-length cycles in the factor graph, performance degradation is expected. Therefore, continuous research is being conducted to design an LDPC code where there is no short-length cycle.

The LDPC code, proposed by Gallager, is defined by a parity check matrix in which major elements have a value of 0 and minor elements except for the elements having the value of 0 have a non-zero value, e.g., a value of 1. For convenience, it will be assumed herein that a non-zero value is a value of 1.

Because a parity check matrix of the LDPC code has a very small weight, even a block code having a relatively long length can be decoded through iterative decoding. When a block length of its block code is continuously increased, the LPDC code exhibits performance approximating the channel capacity limit of Shannon's channel coding theorem, like the turbo code. Therefore, the next generation communication system tends to positively use the LDPC code as the error correction code. Herein, for example, the next generation communication system is one of IEEE (Institute of Electrical and Electronics Engineers) 802.11n communication system, IEEE 802.16e communication system, and DVB-S2 (Digital Video Broadcasting-Satellite 2) communication system.

LDPC codes belong to the family of linear block codes. The encoder for a rate $$R_C = \frac{k}{n}$$

block code has k information bits denoted by $\mu=[\mu_1, \ldots, \mu_k]$ that are encoded into n code bits denoted by $\bar{x}=[x_1, \ldots, x_n]$, called a codeword. This codeword is generated/encoded by the linear operation $\bar{x}=\mu \cdot G$, where G is a k by n generator matrix that defines the encoder. The codeword $\bar{x}$ is said to be in the code set C, which is the set of all codewords for the encoder defined by G. Unless otherwise stated, for simplicity all elements and operations of the encoder/decoder are defined on Galois Field GF(2), other higher dimensional Galois Fields may also be used.

The generator matrix G has a dual matrix H, which is an m=n−k by n parity check matrix. These matrices, G and H, are orthogonal, i.e. $G \cdot H^T=0$. Herein, the "T" represents an transpose operation. The parity check matrix H defines a set of m parity check equations that are useful in the decoding process. The decoder can determine whether a received codeword estimate $\tilde{x}$ is a valid codeword $\bar{x}=\mu \cdot G$ in the code set C by computing $\tilde{x} \cdot H^T$ before decoding the codeword estimate. Hence, $\tilde{x}$ is a valid codeword $\bar{x}$ when $\tilde{x} \cdot H^T=(\mu \cdot G) \cdot H^T=0$, otherwise if $\tilde{x} \cdot H^T \neq 0$ then an error is detected. The decoder should be able to find the closest or the most likely codeword that was transmitted for each received codeword estimate. For more details on decoding of general linear block codes see Shu Lin and Daniel Costello "Error Control Coding: Fundamentals and Applications", Prentice Hall.

LDPC codes are defined by an m by n sparse parity check matrix in which there is a lower density of ones compared to zeros. In general, the goal is to find a sparse generator matrix and a sparse parity check matrix for encoding and decoding.

These codes lend themselves to iterative decoding structures to realise near-Shannon capacity performance. The impressive performance of LDPC codes is realised by applying soft decision iterative decoding techniques such as the belief propagation (BP) algorithm, that is, sum-product algorithm, as described by Jinghu Chen and Marc P. C. Fossorier, "Decoding Low-Density Parity Check codes with Normalized APP-Based Algorithm", 2001, IEEE, or Ajay Dholakia et. al, "Capacity-Approaching Codes: Can They Be Applied to the Magnetic Recording Channel?". IEEE Communications Magazine, pp 122-130, February 2004, and Engling Yeo et. al., "Iterative Decoder Architectures", IEEE Communication Magazine, pp 132-140, August 2003.

The soft decision iterative decoding schemes based on the BP algorithm work on the concept of bipartite Tanner graphs as described in Frank R Kschischang, "Codes Defined on Graphs", IEEE Communication Magazine, pp 118-125, August 2003 and Tom Richardson, "The Renaissance of Gallager's Low-Density Parity-Check Codes", IEEE Communications Magazine, pp 126-131, August 2003.

A bipartite Tanner graph, is a set of graph vertices decomposed into two disjoint sets where these disjoint sets of vertices are a plurality of bit nodes (also called variable nodes or symbol nodes) and a plurality of parity check nodes, hereinafter called check nodes. The graph is bipartite as no two graph vertices within the same set are adjacent. That is, bit nodes are not connected via graph edges to each other, similarly with the check nodes.

Bipartite Tanner graphs are defined by the m by n parity check matrix H. Each bit node is connected via graph edges to a set of check nodes defined by $M(i)=\{j|H_{i,j}=1\}$ for bit node i, wherein $1 \leq j \leq m$, and m is the number of check nodes (or number of rows in H). Similarly, each check node is connected via graph edges to a set of bit nodes defined by $N(j)=\{i|H_{i,j}=1\}$ for check node j, wherein $1 \leq i \leq n$, and n is the number of bit nodes (or the number of columns of H and the number of code bits per codeword).

The iterative decoding algorithms that are based on the concept of bipartite Tanner graphs are called message passing algorithms. Conceptually, these algorithms use the structure of the Tanner graph to "pass" messages, along graph edges, from the bit nodes to check nodes and vice versa. Typically, in implementing an iterative algorithm, the messages can be variables stored in a memory, for example a set of messages for each bit node i that are passed to a set of check nodes can be stored as variables in an array, and operated on as such. The use of the terms, "pass" or "message passing" and the like, are for illustrative purposes to describe the iterative decoding algorithms that follow with reference to Tanner graphs.

The messages are used to iteratively estimate the code bits of the codeword to be estimated. In one iteration of an iterative decoding algorithm, each bit node passes messages, called bit node messages, that represent an estimate of its respective code bit to all neighbouring check nodes (i.e. those check nodes associated/connected with that bit node via edges). Each neighbouring check node also receives from other neighbouring bit nodes additional bit node messages. The neighbouring check nodes passes back to the original bit node a combination of all these bit node messages via messages called check node messages. This process occurs for every bit node, hence each bit node receives a check node message from each of its neighbouring check nodes and can combine these to form an estimate of its respective code bit. Overall, in each iteration an estimate of a codeword is produced.

Although Tanner graphs can operate on messages based in the Galois Field GF(2), in soft decision iterative decoding algorithms these messages typically represent probabilities or log-likelihood ratios thereof. Hence these messages and operations are not limited to being defined on GF(2), but can be defined on other fields such as, for example, the field of real numbers r.

More specifically in terms of LDPC codes, each bit node i passes a set of bit node messages to the set of check nodes M(i), which are used in each check node to update the check node messages. Similarly, each check node j passes a set of check node messages to the set of bit nodes N(j). In each iteration of these algorithms, there are two main processes called the bit node update process, which updates the bit node messages, and the check node update process, which updates the check node messages.

The bit node and check node messages are considered the information obtainable from the received codeword about the transmitted codeword, which is called extrinsic bit node and check node messages (these terms may hereinafter be used interchangeably). In essence, these messages represent the reliability or the belief for the estimate of the n code bits of the transmitted/received codeword.

In the bit node update process, the bit nodes receive a priori information related to the channel, hence in an additive white gaussian noise (AWGN) channel, for example, bit node i receives the log likelihood ratio of the i-th bit of the received code word estimate given by the intrinsic information $$I_i = \frac{2}{\sigma^2} y_i,$$

where $\sigma^2 = N_0/2$ is the variance of the AWGN and $N_0/2$ is the power spectral density. The intrinsic information $$I_i = \frac{2}{\sigma^2} y_i$$

is used to initialise the BP algorithm—or for that matter most of the other algorithms as well.

The bit node message that is passed from bit node i to check node j is denoted as $T_{i,j}$. This message $T_{i,j}$ is updated by summing the set of check node messages passed from the set of check nodes M(i) to bit node i, but excluding the check node message passed from check node j to bit node i. This update process requires fewer computational resources (or has a lower complexity) compared with the check node update process.

It is the check node update process that contributes the greatest complexity to the computation of the BP algorithm. The computational burden comes from a non-linear function, $\Phi(\bullet)$ (defined below in equation (3)), used in each check node message update.

In the check node update, the check node message that is passed from check node j to bit node i is denoted by $E_{j,i}$. Each check node message $E_{j,i}$ is updated by summing $\Phi(T_{i,j})$ over the set of bit node messages passed from the set of bit nodes N(j) to check node j, but excluding the bit node message $T_{i,j}$ passed from bit node i to check node j. Finally, $E_{j,i}$ is updated by reapplying $\Phi(\bullet)$ to the non-linear summation of $\Phi(T_{i,j})$.

In an attempt to simplify matters, the sign of $E_{j,i}$ and the magnitude of $E_{j,i}$ are computed separately. However, it is the magnitude of $E_{j,i}$ that contributes towards the overall complexity of the check node update process.

The iterations of the BP algorithm continue until either a predetermined or maximum number of iterations is achieved, or until algorithm has converged, that is the bit node messages have converged. A soft decision (denoted $T_i$) for bit node i is calculated by summing the intrinsic information $I_i$ and the set of check node messages that are passed from the set of check nodes M(i) to bit node i. A hard decision is formed for each of the soft decisions $T_i$ producing $z_i$ giving the estimate codeword $$\tilde{z} = [z_1, \ldots, z_n].$$

The parity check equations are applied, $\tilde{z} \cdot H^T$, to check if the estimated codeword is in error and depending on the error correction capability of the code the codeword can decoded accordingly giving the information estimate $$\tilde{\mu} = [\mu_1, \ldots, \mu_k].$$

The complexity of the decoding process is primarily, due to the non-linear function used in the check node update process. Hence, reducing the complexity of this process is the focus of current research in the field of LDPC Codes. Several examples of reduced complexity LDPC decoders are disclosed in US 2005/0204271 A1 and US 2005/0138519 A1.

A simplified LDPC decoding process is disclosed in US 2005/0204271 A1, which describes an iterative LDPC decoder that uses a "serial schedule" for processing the bit node and check node messages. Schedules are updating rules indicating the order of passing messages between nodes in the Tanner graph. As well, an approximation to the BP algorithm called the Min-Max algorithm is used in the iterative decoding process in order to reduce the complexity of the check node update process.

This is achieved by using a property of the non-linear function, $\Phi(\bullet)$, in which small values of $T_{i,j}$ contribute the most to the summation of $\Phi(\bullet)$. So, for each check node j, the smallest magnitude bit node message is selected from the set of bit node messages passed to check node j. Only this bit node message is used in the approximation, for updating check node j. That is the least reliable bit node message is used and the most reliable bit node messages are discarded.

However, although a reduction in complexity is achieved, the result is a dramatic reduction in bit and frame error rate performance compared to the BP algorithm. This is due to the fact that the discarded extrinsic information $T_{i,j}$ has not been used in the check node update.

US 2005/0138519 A1 discloses an LDPC decoding process that simplifies the iterative BP algorithm by using a reduced set of bit node messages, i.e. a predetermined number, $\lambda > 1$, of bit node messages from the set of bit nodes N(j) that are passed to check node j are used in the check node update process. Hence, only the bit nodes that pass the bit node messages with the lowest magnitude levels (smallest or least reliable bit node messages) to check node j are identified and used in the check node update process.

The BP algorithm is then applied to this reduced set of bit node messages in the check node update process. This simplification results in what is called the Lambda-Min algorithm, for more details see F. Guilloud, E. Boutillon, J. L. Danger, "Lambda-Min Decoding Algorithm of Regular and Irregular LDPC Codes", 3nd International Symposium on Turbo Codes and Related Topics, Brest, France, pp 451-454, September 2003. However, there is only a slight decrease in complexity compared with the BP-algorithm, and typically a large gap in the complexity and performance between $\lambda$ and $\lambda+1$ type Lambda-Min algorithms leading to, what is called, poor granularity in terms of both complexity and performance, where a desired performance is not achievable due to computational resources not being available.

Therefore, there is a need for a LDPC decoding scheme capable of reducing a complexity and maintaining a performance.

SUMMARY OF THE INVENTION

It is, therefore, an object of the present invention to provide an apparatus and method for receiving signals using a LDPC code in a communication system.

It is another object of the present invention to provide an apparatus and method for receiving signals using a LDPC code, with reduced coding complexity, in a communication system.

According to one aspect of the present invention, there is provided an apparatus for receiving a signal in a signal reception apparatus of a communication system using a low density parity check (LDPC) code. The apparatus includes decoder for decoding a received signal according to a hybrid decoding scheme, wherein the hybrid decoding scheme is generated by combining two of a first decoding scheme, a second decoding scheme, and a third decoding scheme.

According to another aspect of the present invention, there is provided an apparatus for receiving a signal in a signal reception apparatus of a communication system using a low density parity check (LDPC) code. The apparatus includes decoder for decoding a received signal according to a hybrid decoding scheme; wherein the decoder updates a plurality of bit nodes, and updates a plurality of check nodes; wherein the hybrid decoding scheme is generated by combining two of a first decoding scheme, a second decoding scheme, and a third decoding scheme.

According to another aspect of the present invention, there is provided an apparatus for iteratively decoding a low density parity check (LDPC) code in a signal reception apparatus of a communication system. The apparatus includes an iterative LDPC decoder for updating a plurality of check nodes; wherein the iterative LDPC decoder, for each check node, determines a first subset of bit node messages from the set of bit node messages for use in updating each check node; selects a first algorithm for use in updating a first subset of check node messages corresponding to the first subset of bit node messages; determines a second subset of bit node messages, excluding the first subset of bit node messages, for use in updating each check node; and selects a second algorithm for updating a second subset of check node messages corresponding to the second subset of bit node messages.

According to another aspect of the present invention, there is provided a method for receiving a signal in a signal reception apparatus of a communication system using a low density parity check (LDPC) code. The method includes decoding a received signal according to a hybrid decoding scheme, wherein the hybrid decoding scheme is generated by combining two of a first decoding scheme, a second decoding scheme, and a third decoding scheme.

According to another aspect of the present invention, there is provided a method for receiving a signal in a signal reception apparatus of a communication system using a low density parity check (LDPC) code. The method includes decoding a received signal according to a hybrid decoding scheme; wherein decoding the received signal according to the hybrid decoding scheme comprises: updating a plurality of bit nodes; and updating a plurality of check nodes; wherein the hybrid decoding scheme is generated by combining two of a first decoding scheme, a second decoding scheme, and a third decoding scheme.

According to another aspect of the present invention, there is provided a method for iteratively decoding a low density parity check(LDPC) code in a signal reception apparatus of a communication system. The method includes updating a plurality of check nodes; wherein updating the plurality of check nodes comprises: for each check node, determining a first subset of bit node messages from the set of bit node messages for use in updating each check node; selecting a first algorithm for use in updating a first subset of check node messages corresponding to the first subset of bit node messages; determining a second subset of bit node messages, excluding the first subset of bit node messages, for use in updating each check node; and selecting a second algorithm for updating a second subset of check node messages corresponding to the second subset of bit node messages.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will now be described in detail with reference to the annexed drawings. In the following description, a detailed description of known functions and configurations incorporated herein has been omitted for the sake of clarity and conciseness.

The present invention discloses an apparatus and method for receiving signals in a communication system using a Low Density Parity Check (LDPC) code. And, the present invention discloses an apparatus and method for receiving signals using a LDPC code, with reduced coding complexity, in a communication system.

In particular, the present invention proposes an apparatus and method for receiving signals so as to reduce a complexity and maintain a performance by using one of a plurality of hybrid decoding schemes according to a situation of a communication system using a LDPC code. Herein, each of the plurality of hybrid decoding schemes is generated by combining two of a Belief Propagation algorithm, that is, sum-product algorithm, Min-Sum algorithm, and Lambda-Min algorithm.

Figure 1:
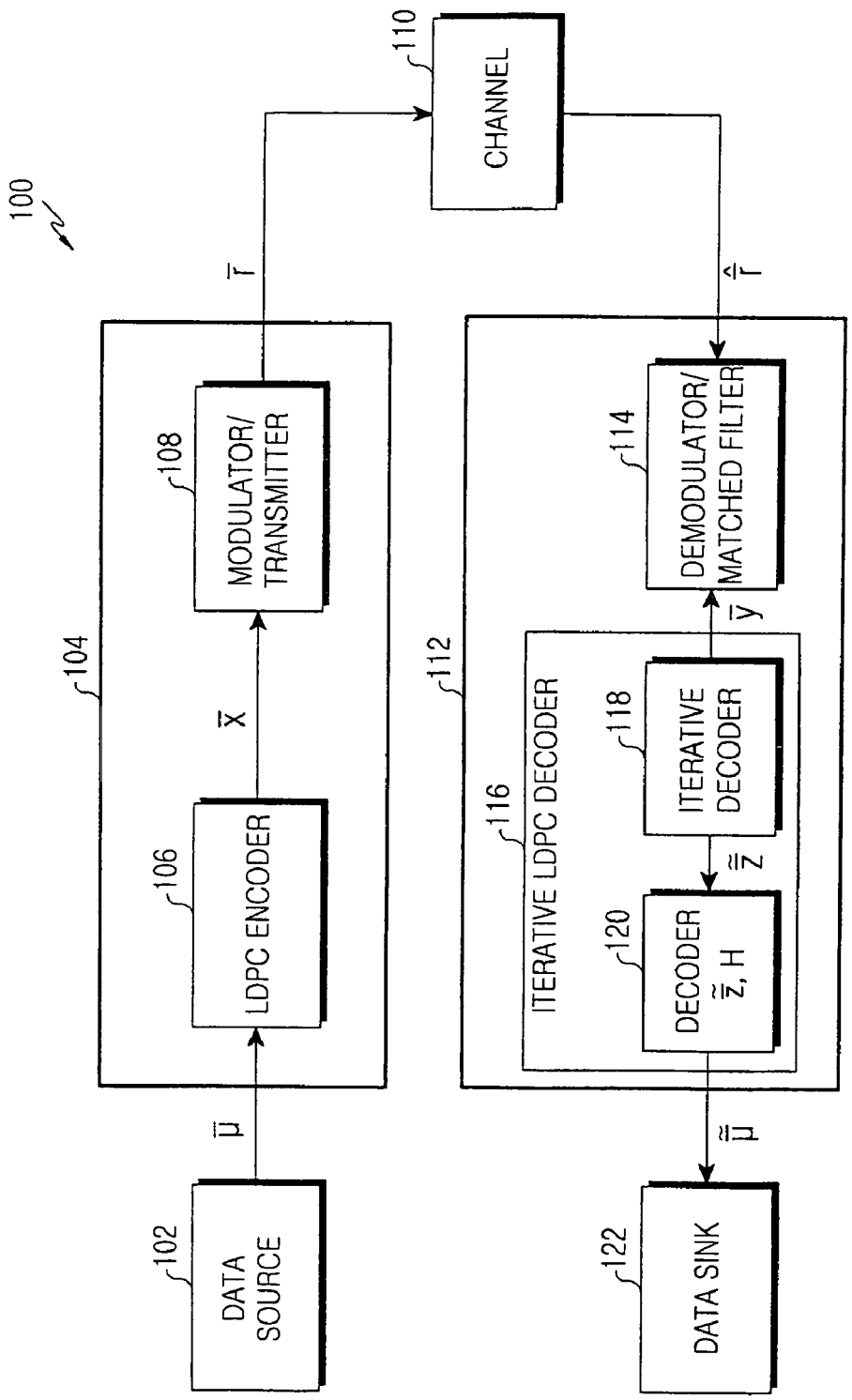
FIG. 1 is a diagram illustrating a structure of a communication system using a LDPC code according to the present invention.

FIG. 1 is a diagram illustrating a structure of a communication system using a LDPC code according to the present invention.

Referring to FIG. 1, a communication system using a LDPC code 100 includes an transmitter unit 104 and receiver unit 112. The transmitter unit 104 includes a LDPC encoder 106 and a modulator/transmitter 108. The receiver unit 112 includes a demodulator/matched filter 114 and an iterative LDPC decoder 116. The iterative LDPC decoder 116 includes an iterative decoder 118 and a decoder 120.

The transmitter unit 104 receives information bits from a data source 102, and has an LDPC encoder 106 and a modulator/transmitter 108. The coded signal is transmitted to the receiver unit 112 via a communications channel 110. The receiver unit 112 has the corresponding components necessary for receiving the coded signal, they are, a demodulator/matched filter 114, an iterative LDPC decoder 116, where an estimate of the transmitted coded information is forward to a data sink 122.

The data source 102 generates information bits grouped into a block of k information bits denoted by $$\overline{\mu} = [\mu_1, \ldots, \mu_k]$$

for encoding at the LDPC encoder 106. The LDPC encoder 106 has a code rate of $$R_C = \frac{k}{n}$$

and encodes the block of k information bits $\overline{\mu}$ into a block of n code bits i.e. into a codeword $\overline{x}=[x_1, \ldots, x_n]$. In general the codeword $\bar{x}$ is generated by $\bar{x}=\mu \cdot G$, where G is the k by n generator matrix that defines the LDPC encoder 106. The codeword $\bar{x}$ is in the code set C, which is the set of all codewords of the LDPC encoder 106 defined by G. All elements and operations performed on $\mu=[\mu_1, \ldots, \mu_k]$, $\bar{x}=[x_1, \ldots, x_n]$, and G are defined, but are not limited, on Galois Field GF(2), where the use of higher dimensions, e.g. $GF(q^r)$ where q and r are integers is possible, for example, codes with symbols from $GF(2^m)$ m>0 are most widely used.

The codeword $\bar{x}$ for is modulated for transmission over the communications channel 110 as the n-dimensional transmitted signal $\bar{r}$. For simplicity the communications channel 110 is assumed to be an additive white gaussian noise channel (AWGN). In this channel, the noise is a random variable having a normal distribution with 0 mean and variance of $\sigma^2=N_0/2$, where $N_0/2$ is the power spectral density. Any other communications channel may be applied such as multipath channels, etc. The transmitted signal $\bar{r}$ is corrupted by the AWGN giving the n-dimensional received signal $$\hat{r} = \bar{r} + n,$$

where n is the n-dimensional vector of AWGN samples. The receiver unit 112 receives the noisy signal $\hat{r}$ and demodulates this signal by demodulator/matched filter 114 giving the n dimensional codeword $\bar{y}=[y_1, \ldots, y_n]$.

The iterative LDPC decoder 116 has two units, the iterative decoder 118, which produces an estimated codeword $$\tilde{z} = [z_1, \ldots, z_n],$$

and the error detection and the decoder 120, which checks then decodes the estimated codeword $$\tilde{z} = [z_1, \ldots, z_n]$$

into an estimate of the k information bits $\tilde{\mu}=[\tilde{\mu}_1, \ldots, \tilde{\mu}_k]$, sent by the transmitter. The information bits $\tilde{\mu}$ are forwarded to the data sink 122.

As mentioned previously, the generator matrix G has a dual matrix H, which is the m=n−k by n parity check matrix where $G \cdot H^T=0$. Herein, the "T" represents an transpose operation. The parity check matrix H defines a set of m parity check equations that are useful in the decoding process. LDPC codes are defined by an m by n sparse parity check matrix in which there is a lower density of ones compared to zeros. In general, the goal is to find a sparse generator matrix and a sparse parity check matrix for encoding and decoding.

Figure 2:
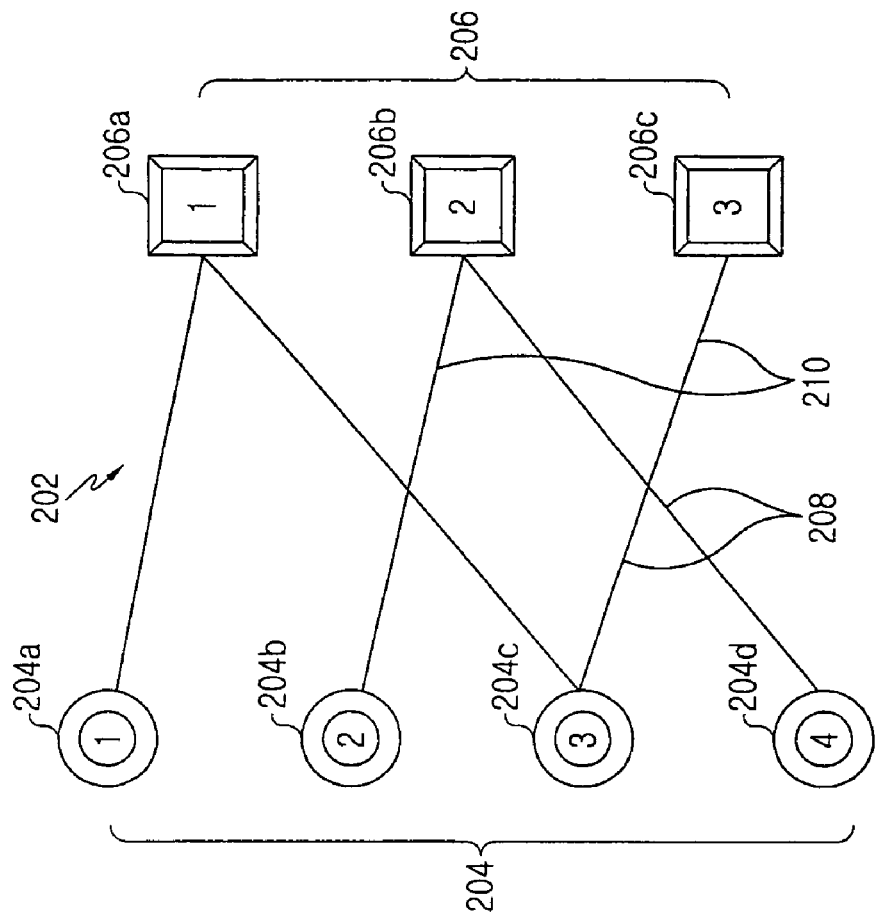
FIG. 2 illustrates an example of the relationship between the parity check matrix and the corresponding Tanner Graph.

Once the iterative decoder 118 has estimated the codeword $\tilde{z}$, the decoder 120 determines if $\tilde{z}$ is a valid codeword in the code set by computing $\tilde{z} \cdot H^T$. If $\tilde{z}$ is a valid codeword then $$\tilde{z} \cdot H^T = \tilde{\mu} \cdot (G \cdot H^T) = 0$$

and hence $\tilde{z}$ can be decoded into k information bits $\tilde{\mu}$, otherwise an error is detected. An example of a parity check matrix H 200 (this is an example only using a random matrix H) is shown in FIG. 2, the first row corresponds to the first parity check equation, which can be written as $p_1 = H_{1,1} \oplus H_{1,3}$ where $\oplus$ is an x or operation or modulo-2 addition in GF(2). If $$\tilde{z} = [1, 0, 1, 1],$$

then $p_1=1$, $p_2=1$, and $p_3=0$ and an error would be detected, otherwise the codeword $\tilde{z}$. Depending on the number of errors the decoder 120 can correct the codeword $\tilde{z}$ may be decoded correctly into $\tilde{\mu}=[\tilde{\mu}_1, \ldots, \tilde{\mu}_k]$ or an error may be detected.

It is the task of the iterative decoder 118 to determine/find the closest or the most likely codeword that was transmitted for each received coded signal $\hat{r}$ and $\bar{y}$. The iterative decoding structures used in the iterative LDPC decoder 116 are outlined in the following description. However, to understand the concept of iterative decoding, an overview of the bipartite Tanner graph that is used in the following iterative decoding algorithms is given.

Referring now to FIG. 2, an example of a parity check matrix H 200 with its corresponding bipartite Tanner graph 202 is shown. The iterative decoder 118 uses soft decision iterative decoding algorithms that work on the concept of message passing (as described previously) between the bit nodes 204 (204a-204d) and check nodes 206 (206a-206c) over the edges of the bipartite Tanner graph 202. The use of the terms, "pass" or "message passing" and the like, are for illustrative purposes to describe the iterative decoding algorithms that follow with reference to Tanner graphs.

In a preferred embodiment, the parity check matrix H 200 is stored in memory at the iterative LDPC decoder 116. The bipartite Tanner Graph 202 described in FIG. 2 is a representation for describing the following iterative decoding algorithms.

Bipartite Tanner graphs 202 consist of a plurality of bit nodes 204 (n bit nodes) and a plurality of parity check nodes 206 (m=n−k check nodes). These graphs 202 are defined by the parity check matrix H 200. Each bit node 204 (e.g. bit node 204c) is connected via graph edges (e.g. edges 208) to a set of check nodes (e.g. 206a and 206c) defined by M(i)= $\{j|H_{i,j}=1\}$ for bit node i, wherein $1 \leq j \leq m$ and m is the number of check nodes 206 (or number of rows in H). Similarly, each check node (e.g. check node 206b) is connected via graph edges (e.g. edges 210) to a set of bit nodes (e.g. 204b and 204d) defined by N(j)=$\{i|H_{i,j}=1\}$ for check node i, wherein $1 \leq i \leq n$, and n is the number of bit nodes 204 (or the number of columns of H and the number of code bits per codeword).

For example, FIG. 2 illustrates that there are graph edges (e.g. 208 and 210) when there is a one in H, for example, the third column of H corresponds to all the edges that connect bit node 204c to the corresponding check nodes, i.e. check node 206a and 206d as there is a 1 in $H_{3,1}$, where $H_{i,j}$ denotes the element of column i and row j. The number of 1's in a column of H, or the column weight, indicates the number of graph edges and check nodes connected to that bit node. The number of 1's in a row of H, or the row weight, indicates the number of graph edges and bit nodes connected to that check node. In addition, the set of bit nodes N(2) for check node 206b include bit nodes 204b and 204d and the set of check nodes M(3) for bit node 204c include the check nodes 206a and 206c. The edges 208, 210 of the bipartite Tanner graph 202 are used in the iterative decoding algorithms to pass (send) messages from the bit nodes 204 to the check nodes 206 and vice versa, as has been previously described and seen in more detail in the following description.

The messages that are passed between check nodes 206 and bit nodes 204, and vice-versa, are stored as variables in a memory, for example a set of messages for each bit node i that are passed to a set of check nodes can be stored as variables in an array. The use of the terms, "pass" or "message passing" and the like, are for illustrative purposes to describe the iterative decoding algorithms that follow with reference to bipartite Tanner graphs.

Each of the BP algorithm, Min-Sum algorithm, Lambda-Min algorithm will be described.

(1) BP Algorithm

In the BP algorithm, each bit node i passes a set of bit node messages to the set of check nodes M(i), which are used in each check node to update the check node messages. Similarly, each check node j passes a set of check node messages to the set of bit nodes N(j). In each iteration of this algorithm, there are two main processes called the bit node update process illustrated in FIG. 3A, which updates the bit node messages, and the check node update process illustrated in FIG. 3B, which updates the check node messages. These messages are used to estimate the code bits and represent the probability or log-likelihood ratio thereof, reliability, or the belief, that the bit and check nodes have for the estimate of each code bit of the received codeword. In the log-likelihood ratio BP algorithm (LLR-BP) the messages that are passed between bit nodes and check nodes are based on probabilities, i.e. log-likelihood ratios thereof.

The LLR-BP algorithm is now described with reference to FIGS. 3A and 3B.

Figure 3A:
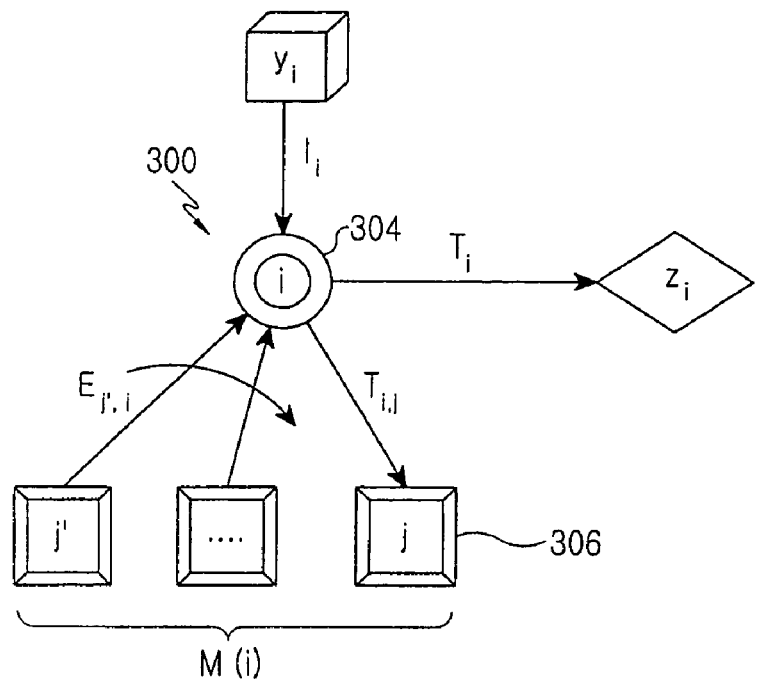
FIG. 3A illustrates the update of bit node messages for bit node i using check node messages sent from the set of check nodes M(i) to calculate each code bit of the codeword estimate.

Referring to FIG. 3A, the bit node update process 300 for updating the bit node message $T_{i,j}$ in each iteration is illustrated for bit node i 304 and the set of check nodes M(i), where $T_{i,j}$ is passed from bit node i 304 to check node j 306. Bit node i 304 receives a priori information related to the channel, for example in an AWGN channel, bit node i 304 receives the log likelihood ratio of the i-th bit of the received code word estimate $\bar{y}=[y_1, \ldots, y_i, \ldots, y_n]$, given by what is called the intrinsic information $$I_i = \frac{2}{\sigma^2} y_i,$$

where $\sigma^2 = N_0/2$ the variance of the AWGN and $N_0/2$ is the power spectral density.

In the first iteration, the intrinsic information is used to initialise the LLR-BP algorithm, where all bit node messages, $T_{i,j}$ for i∈N(j) and $1 \leq j \leq m$ are passed from the set of bit nodes N(j) (not shown) to check node j 306 are set to $$I_i = \frac{2}{\sigma^2} y_i.$$

All check node messages, $E_{j,i}$ for j∈M(i) and $1 \leq i \leq n$, that are passed from the set of check nodes M(i) to bit node i 304 are set to zero.

In subsequent iterations, the message $T_{i,j}$ is updated by summing, with the Intrinsic information, the set of check node messages, $E_{j,i}$ for j'∈M(i)\j and $1 \leq i \leq n$, that are passed from the set of check nodes M(i) to bit node i 304 but excluding the check node message $E_{j,i}$ passed from check node j 306 to bit node i 304 (not shown). The summation is given by:

$$T_{i,j} = I_i + \sum_{j' \in M(i) \setminus j} E_{j',i} \quad (1)$$

In each iteration, a posteriori probabilities (APP) or soft decisions $T_i$ for bit node i 304 can be calculated by summing the Intrinsic information $I_i$ and the set of check node messages, $E_{j',i}$ for j'∈M(i), that are passed from the set of check nodes M(i) to bit node i 304. However, generally, these soft decisions could be calculated in the final iteration. The soft decisions are given by the following equation:

$$T_i = I_i + \sum_{j' \in M(i)} E_{j',i} \quad (2)$$

A hard decision $z_i$ of $T_i$ is formed for each of the i bit nodes producing an estimate of the transmitted code word $\bar{z}$. The parity check equations are applied, $\bar{z} \cdot H^T$, to check if the estimated code word is in error, if not, the codeword is decoded accordingly, otherwise, the error may be corrected depending on the error correction capabilities of the code.

The bit node update process requires few computational resources compared with the check node update process, which is now described.

Figure 3B:
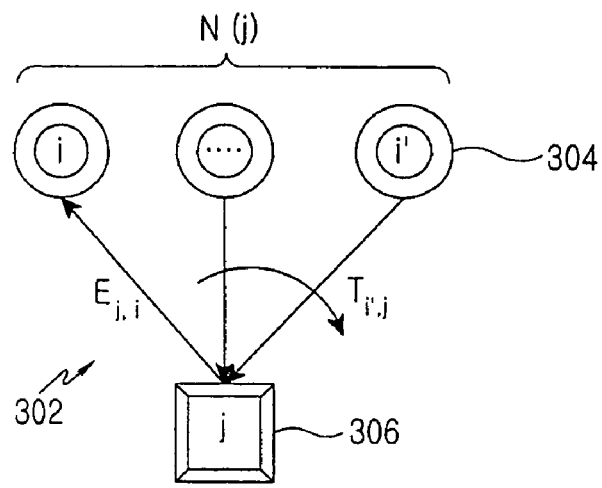
FIG. 3B illustrates the update of the check node messages using bit node messages sent to check node j from the set of bit nodes N(j).

Referring to FIG. 3B, the check node update process 302 is illustrated for updating check node message $E_{j,i}$ in each iteration for check node j 306 and the set of bit nodes N(j), where check node message $E_{j,i}$ is passed from check node j 306 to bit node i 304. As the bit and check node messages are represented by log-likelihood ratios, it is the check node update process that contributes the greatest complexity to the computation of the LLR-BP algorithm. The computational burden comes from the use of the non-linear function, $\Phi(\bullet)$, used in each check node message update, which is given by:

$$\Phi(x) = -\log\left[\tanh\left(\frac{x}{2}\right)\right] \quad (3)$$

Figure 4:
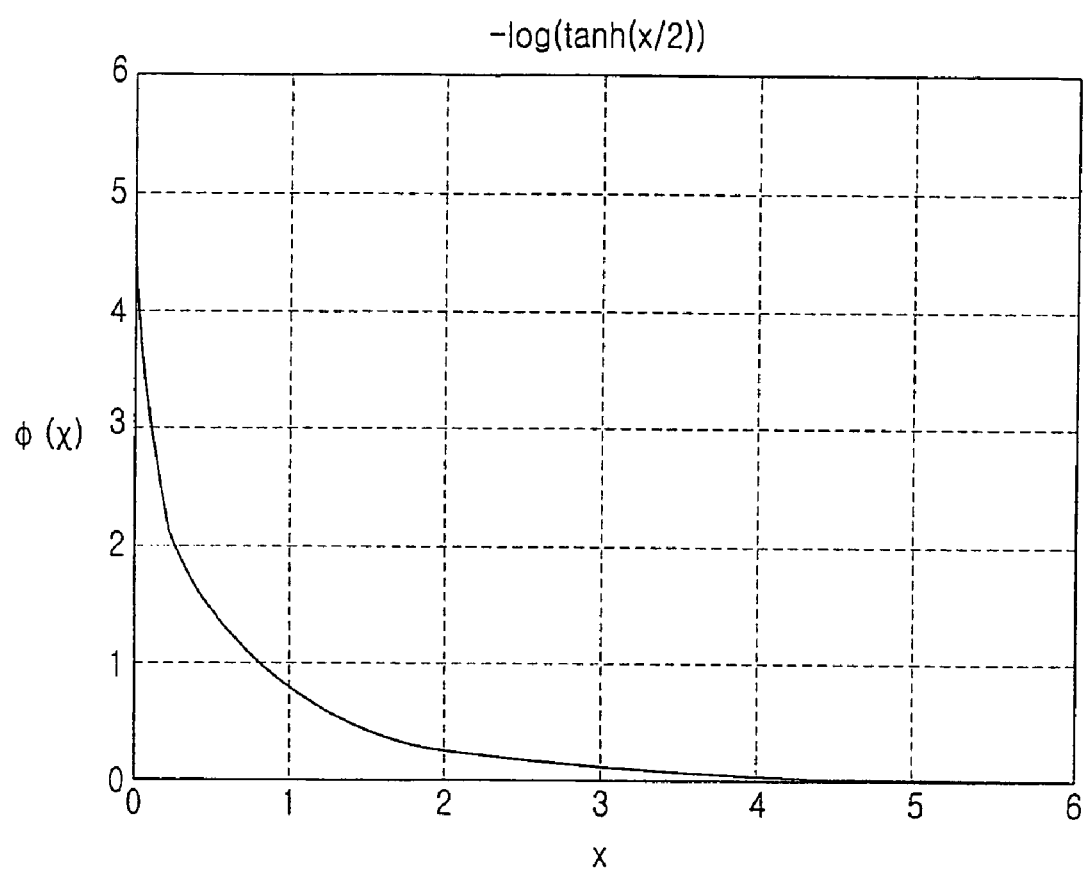
FIG. 4 illustrates a plot of the non-linear function $\Phi(x)$ for $0<x\leq 6$.

An example of the shape of the function $\Phi(\bullet)$ is shown in FIG. 4, as can be seen, small values of x produce large values of $\Phi(x)$.

In an attempt to simplify matters, the sign of $E_{j,i}$ and the magnitude of $E_{j,i}$ are computed separately. However, it is the magnitude of $E_{j,i}$ that contributes towards the overall complexity of the check node update process.

Each check node message $E_{j,i}$ is updated by summing $\Phi(T_{i,j})$ over the set bit node messages passed from the set of bit nodes N(j) to check node j 306, but excluding the bit node message $T_{i,j}$ from bit node i 304 to check node j 306. Finally, $E_{j,i}$ is updated by reapplying $\Phi(\bullet)$ to the non-linear summation of $\Phi(T_{i,j})$. The magnitude of $E_{j,i}$ is given by:

$$|E_{j,i}| = \Phi\left[\sum_{i' \in N(j) \setminus i} \Phi(|T_{i',j}|)\right] \quad (4)$$

where the sign processing, or $\text{Sign}(E_{j',i})$ is given by:

$$\text{Sign}(E_{j,i}) = \prod_{i' \in N(j) \setminus i} \text{Sign}(T_{i',j}) \quad (5)$$

The iterations of the LLR-BP algorithm continue until either a predetermined or maximum number of iterations are achieved, or until the algorithm has converged, that is the bit node messages have converged.

The complexity of the decoding process is primarily, due to the non-linear function used on the bit node messages (which are log-likelihood ratios) in the check node update process.

Hence, reducing the complexity of this process is the focus of current research in the field of LDPC Codes.

Instead of the summation carried out in equations (1), (2) or (4) of the bit node update and check node update processes, the simplification in the following section may be used. Herein, an algorithm using a simplified computation instead of the summation carried out in equations (1), (2) or (4) of the bit node update and check node update processes is called as "Simplified LLR-BP algorithm"

First, a bit node update process of the Simplified LLR-BP algorithm will de described.

The bit node update process of the LLR-BP algorithm can be simplified by computing the soft decision, $T_i$ first. Referring to FIG. 3A, the bit node message, $T_{i,j}$, (the extrinsic information), that is passed from bit node i 304 to check node j 306 is updated by:

$$T_{i,j} = I_i + \sum_{j' \in M(i) \setminus j} E_{j',i} \qquad (6)$$

$$= I_i + \left( \sum_{j' \in M(i)} E_{j',i} - E_{j,i} \right)$$

$$= T_i - E_{j,i}$$

This slightly reduces the complexity of the bit node update process as only the sum $$\sum_{j' \in M(i)} E_{j',i}$$

is required to be computed once per bit node i 304, for $1 \leq i \leq n$.

Second, a check node update process of the Simplified LLR-BP algorithm will de described.

Referring to FIG. 3B, the check node update process of the LLR-BP algorithm is simplified by computing the summation of all non-linear functions $\Phi(|T_{i',j}|)$ over $i' \in N(j)$. The processing of the $Sign(E_{j,i})$ is kept the same, however, the magnitude $|E_{j,i}|$ is simplified by the following:

$$S_j = \sum_{i' \in N(j)} \Phi(|T_{i',j}|) \qquad (7)$$

$$|E_{j,i}| = \Phi \left[ \sum_{i' \in N(j) \setminus i} \Phi(|T_{i',j}|) \right] \qquad (8)$$

$$= \Phi \left[ \sum_{i' \in N(j)} \Phi(|T_{i',j}|) - \Phi(|T_{i,j}|) \right]$$

$$= \Phi[S_j - \Phi(|T_{i,j}|)]$$

The non-linear function $\Phi(\cdot)$ is called in a full summation once per check node j 306. However, although this goes someway to reduce the complexity of the LLR-BP algorithm, it is still computationally intensive and difficult to implement on hardware having a limited amount of computing capabilities, for example mobile phones, TV receivers, or any other wireless transceiver.

(2) Min-Sum Algorithm

In order to reduce the complexity of the check node update process, the Min-Sum algorithm was proposed in the literature as a sub-optimal algorithm that can be used in the soft decision iterative decoding of LDPC codes instead of the LLR-BP algorithm.

The bit node update process in the Min-Sum algorithm is the same as that of the LLR-BP algorithm. It is the check node update process that is greatly simplified at the cost of decreased performance.

For each check node j, the check node update process can be simplified by observing that small values of $T_{i,j}$ result in large values of $\Phi(T_{i,j})$, see FIG. 4. Hence small values of $T_{i,j}$ contribute more to the summation $$\sum_{i' \in N(j) \setminus i} \Phi(|T_{i',j}|)$$

of equations (4) or (8) of the LLR-BP algorithm than larger values of $T_{i,j}$. As well, small values of $T_{i,j}$ represent a lower reliability bit node message and these are more important to the final decision than larger values of $T_{i,j}$. The complexity of the call to the function $\Phi(T_{i,j})$ can be avoided by considering the following approximation:

$$\sum_{i' \in N(j) \setminus i} \Phi(|T_{i',j}|) \approx \Phi(|T_{n_0,j}|) \qquad (10)$$

where $$n_0 = \underset{i' \in N(j) \setminus i}{\operatorname{Argmin}} \{|T_{i',j}|\},$$

substituting equation (10) into equation (4) or (8) and exploiting the property $\Phi[\Phi(x)] = x$, then the update for $|E_{j,i}|$ is given by $$|E_{j,i}| = \min_{i' \in N(j) \setminus i} \{|T_{i',j}|\} = |T_{n_0,j}|. \qquad (11)$$

In summary, for each check node j the update of the check node message $|E_{j,i}|$ passed to bit node i, the smallest magnitude bit node message $|T_{n_0,j}|$ is selected from the set of bit nodes $N(j) \setminus i$ that exclude the bit node i. Although the Min-Sum algorithm achieves a dramatic reduction in complexity, it will be seen shortly that this also results in a dramatic reduction in bit and frame error rate performance as compared with the LLR-BP algorithm.

(3) Lambda-Min Algorithm

The Min-Sum algorithm sacrifices performance with complexity, whereas the Lambda-Min algorithm attempts to attain the performance of the LLR-BP algorithm through a higher complexity by using only a predetermined number, $\lambda > 1$, of bit node messages passed from the set of bit nodes $N(j)$ to check node j, during the check node update process.

The bit node update process in the Lambda-Min algorithm is the same as that of the BP algorithm.

As with the Min-Sum algorithm, for each check node j, the check node update process is simplified by observing that small values of $T_{i,j}$ result in large values of $\Phi(T_{i,j})$, as seen in FIG. 4. Hence small values of $T_{i,j}$ contribute more to the summation $$\sum_{i' \in N(j) \setminus i} \Phi(|T_{i',j}|)$$

in equations (4) or (8) of the BP algorithm than larger values of $T_{i,j}$.

As opposed to the Min-Sum algorithm, the Lambda-Min algorithm updates the extrinsic check node messages passed from the check nodes to bit nodes, by relying on just the $\lambda > 1$ least reliable bit nodes and hence the most contributing bit nodes are used within the aggregated sum of either equations (4) or (8).

In particular, the check node update process of check node j, $1 \leq j \leq m$, is given as follows:

Identify a set of bit nodes, i.e. $\lambda$ bit nodes, that pass bit node messages to check node j by:

$$N_\lambda(j) = \{i \in N(j) | \lambda \text{ lowest} |T_{i,j}|\}$$

The check node messages for check node j is updated by only using the $N_\lambda(j)$ bit node messages:

$$|E_{j,i}| \approx \Phi\left[\sum_{i' \in N_\lambda(j) \setminus i} \Phi(|T_{i',j}|)\right]$$

Next, hybrid decoding schemes will be described.

As described above, each of the plurality of hybrid decoding schemes is generated by combining two of the BP algorithm, the Min-Sum algorithm, and the Lambda-Min algorithm. That is, the number of hybrid decoding schemes according to the present invention is 3. The hybrid decoding schemes according to the present invention include a SET #1 scheme, a SET #2 scheme, and a SET #3 scheme. The SET #1 scheme is generated by combining the BP algorithm with the Min-Sum algorithm. The SET #2 scheme is generated by combining the BP algorithm with the Lambda-Min algorithm. The SET #3 scheme is generated by combining the Lambda-Min algorithm with the Min-Sum algorithm.

(1) SET #1 Scheme

It has been realised that valuable information is lost by using the Min-Sum algorithm due to the discarded extrinsic information $T_{i,j}, \forall i \in N(j) \setminus n_0$ for check node j.

Instead, a preferred embodiment of the invention updates the check nodes, in each iteration, by exploiting the contributions from bit nodes by prioritising, in terms of computational resources or complexity, the most contributing bit node $n_0$, where $$n_0 = \underset{i' \in N(j)}{\operatorname{Argmin}}\{|T_{i',j}|\},$$

to update the extrinsic check node messages $E_{j,n_0}$ being passed to that bit node $n_0$ over the less contributory bit nodes that update the remaining extrinsic check node messages $E_{j,i}, \forall i \in N(j) \setminus n_0$.

In general, this is achieved by:

Identifying for each check node j, $1 \leq j \leq m$, the least reliable bit node by finding the smallest bit node message $T_{i,j}, \forall i \in N(j)$ among the set of bit nodes $N(j)$, that is $n_0 = \underset{i \in N(j)}{\arg \min}\{|T_{i,j}|\}$.

Selecting a first algorithm for use in the check node update process, by for example, allocating computational resources to calculate the check node message $E_{j,n_0}$ that is passed from the check node j to bit node $n_0$.

Identifying the remaining set of bit nodes $\forall i \in N(j) \setminus n_0$.

Selecting a second algorithm for use in the check node update process, for example allocating further computational resources, for the remaining bit nodes $\forall i \in N(j) \setminus n_0$ to calculate the remaining check node messages $E_{j,i}, \forall j \in M(i)$.

The result is a check node update process that selects a first algorithm, where the allocation of more computational resources, complexity, and thus more accuracy for estimating the extrinsic check node message sent from a given check node to the bit node generating less reliable bit node messages, (also seen as generating the smallest or most contributing bit node messages). While still taking into account the contribution from other bit nodes in the check node update process by selection of a second algorithm.

Figure 5:
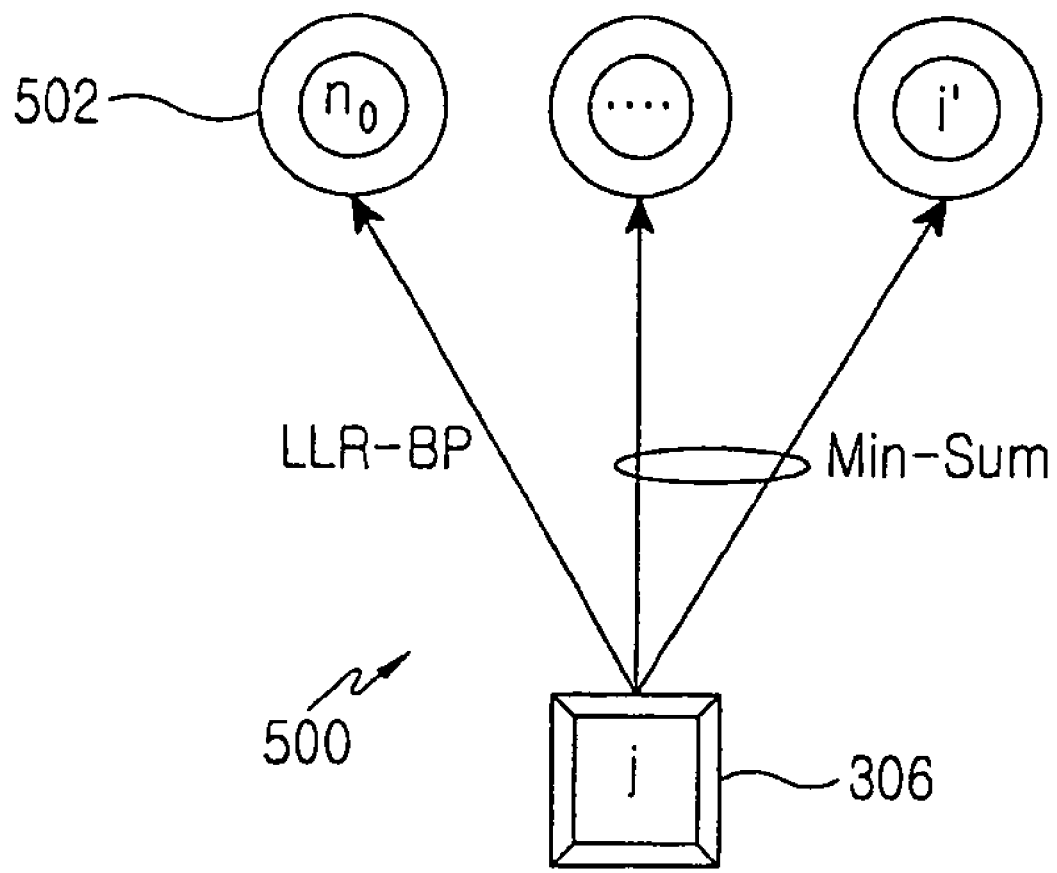
FIG. 5 illustrates an example of a preferred embodiment of the iterative decoding process using a check node update process based on the Belief Propagation and Min-Sum algorithms.

Referring to FIG. 5, a preferred embodiment of the invention for updating the check node message 500 is illustrated that uses as the first algorithm the LLR-BP update rules or the LLR-BP algorithm to update the check node passing the extrinsic check node message to the less reliable bit node 502. While, it uses as the second algorithm the Min-Sum update rules or the Min-Sum algorithm are used to update the check nodes passing extrinsic check node messages to the most reliable bit nodes (or remaining bit nodes).

This results in the following check node update process, for each check node j, $1 \leq j \leq m$:

Identifying:

(a) the least reliable or smallest bit node 502 among $N(j)$:

$$n_0 = \underset{i \in N(j)}{\arg \min}\{|T_{i,j}|\}$$

(b) the remaining set of bit nodes $\forall i \in N(j) \setminus n_0$

Selecting a first and second algorithm for use in the check node update process for check node j 306 to update the extrinsic check node messages as follows:

(a) For the check node message being passed to bit node $n_0$ 502 use as the first algorithm the LLR-BP algorithm (either using equations (4) or (8)) i.e.:

$$n_0: |E_{j,n_0}| = \Phi\left[\sum_{i' \in N(j) \setminus n_0} \Phi(|T_{i',j}|)\right]$$

(b) For check node messages being passed to the remaining bit nodes use as the second algorithm the Min-Sum algorithm:

$$\forall i \in N(j) \setminus n_0: |E_{j,i}| = \underset{i' \in N(j) \setminus i}{\min}\{|T_{i',j}|\} = |T_{n_0,j}|.$$

Figure 6A:
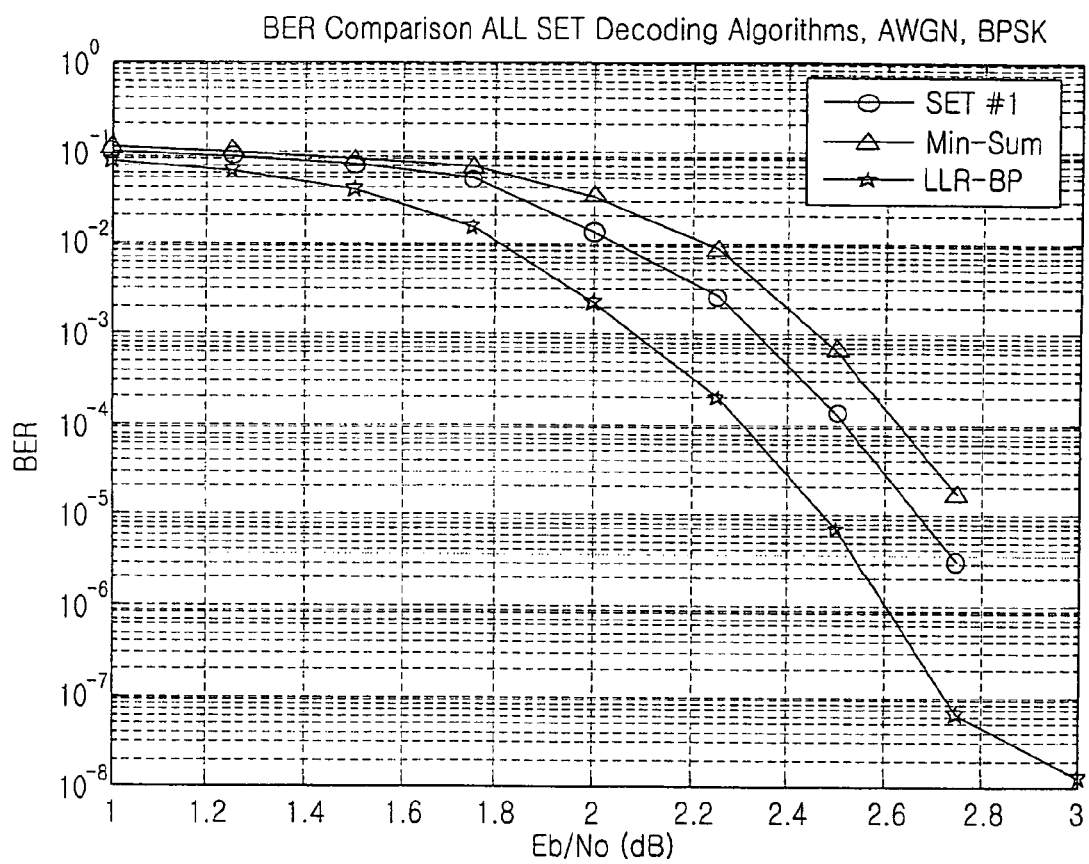
FIG. 6A illustrates simulation results depicting the bit-error-rate performance versus signal-to-noise ratio (Eb/No) for the preferred embodiment of FIG. 5.
Figure 6B:
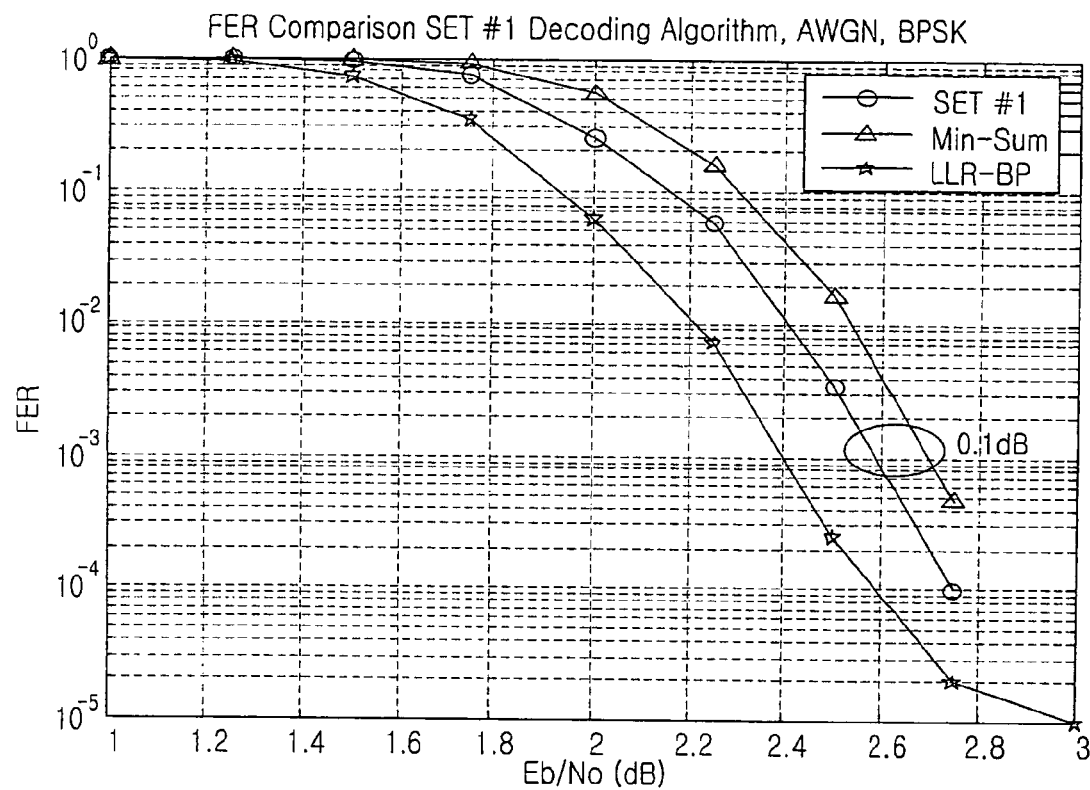
FIG. 6B illustrates simulation results depicting the frame-error-rate performance versus signal-to-noise ratio (Eb/No) for the preferred embodiment of FIG. 5.

Referring now to FIGS. 6A and 6B, a comparison of the error performance is made with respect to the reference LLR-BP and Min-Sum algorithms and this preferred embodiment. The communication system model uses the IEEE 802.16e standard for communication and the LDPC code used is a rate $$R_C = \frac{2}{3}$$

LDPC code having a frame length of Zf=96 bits. The simulated bit error rate (BER) vs SNR($E_b/N_0$) for this system is shown in FIG. 6A and the simulated frame error rate (FER) vs SNR ($E_b/N_0$) for this system is shown in FIG. 6B.

Referring to FIG. 6A, the performance gain of the preferred embodiment is 0.1 dB at a BER=$10^{-4}$ over that of the Min-Sum algorithm. This improved performance gain is exceptional considering the only slight increase in computational complexity.

The computational complexity of the reference algorithms and this preferred embodiment is shown in Table 1. The complexity of the preferred embodiment is given in the row labelled SET#1 and is shown to be less than the LLR-BP algorithm and closer to that of the Min-Sum algorithm.

TABLE 1

|  |  | simple operation | Multiplication | Non-Linear Function |
|---|---|---|---|---|
| Variable Node Messages |  | $2 \cdot d_v \cdot n$ |  |  |
| Tentative Decoding |  | $m \cdot (d_c + 1)$ |  |  |
| Check Node Messages | LLR-BP | $5 \cdot d_c - 2$ |  | $2 \cdot d_c$ |
|  | Min-Sum | $5 \cdot d_c - 4$ |  |  |
|  | Lambda-Min | $-\frac{\lambda^2}{2} + \lambda \cdot \left(d_c + \frac{3}{2}\right) + (3 \cdot d_c - 2)$ |  | $2 \cdot \lambda + 1$ |
|  | A-Min* | $5 \cdot d_c - 2$ |  | $d_c + 2$ |
|  | SET #1 | $5 \cdot d_c - 4$ |  | $d_c$ |
|  | SET #2 | $-\frac{\lambda^2}{2} + \lambda \cdot \left(d_c + \frac{1}{2}\right) + (4 \cdot d_c - 3)$ |  | $d_c + \lambda + 1$ |
|  | SET #3 | $-\frac{\lambda^2}{2} + \lambda \cdot \left(d_c + \frac{3}{2}\right) + (3 \cdot d_c - 2)$ |  | $2 \cdot \lambda$ |
| Corrected Min-Sum | (alpha, 0) | $5 \cdot d_c - 4$ | 2 |  |
|  | (1, beta) | $5 \cdot d_c$ |  |  |
|  | (alpha, beta) | $5 \cdot d_c$ | 2 |  |
| Compensated Lambda-H in | (alpha, 0) | $-\frac{\lambda^2}{2} + \lambda \cdot \left(d_c + \frac{3}{2}\right) + (3 \cdot d_c - 2)$ | $\lambda + 1$ | $2 \cdot \lambda + 1$ |
|  | (1, beta) | $-\frac{\lambda^2}{2} + \lambda \cdot \left(d_c + \frac{7}{2}\right) + 3 \cdot d_c$ |  | $2 \cdot \lambda + 1$ |
|  | (alpha, beta) | $-\frac{\lambda^2}{2} + \lambda \cdot \left(d_c + \frac{7}{2}\right) + 3 \cdot d_c$ | $\lambda + 1$ | $2 \cdot \lambda + 1$ |
| Flarion1 (Theoritical) |  | $(2^{q-1} + 6) \cdot d_c - 2$ |  |  |
| Flarion2 (Implementation) | Energy Cycles | $27 \cdot d_c - 2$ $8 \cdot d_c - 2$ |  |  |

The complexity is given in terms of the degree of the check and bit nodes (also called variable nodes) denoted $d_c$ and $d_v$ respectively. The degree of a check node is the row weight of the parity check matrix H, which represents the number of bit nodes that pass bit node messages to that check node. Similarly, the degree of a bit (or variable node) is the column weight of the parity check matrix H, which is the number of check node messages that are passed to a bit node.

Referring to FIG. 6B, the performance degradation of the preferred embodiment is only 0.2 dB compared with that of the LLR-BP algorithm.

The bit node update process in this preferred embodiment is the same as that of the LLR-BP algorithm. It is clear, that this preferred embodiment allows for low complexity decoding of LDPC codes with a performance gain increase of 0.1 dB with respect to the Min-Sum algorithm, while maintaining a complexity close to it.

(2) SET #2 Scheme

It has been realised that valuable information is still lost by using the Lambda-Min algorithm due to the discarded extrinsic information $T_{i,j} \forall i \in N(j) \backslash N_\lambda(j)$ that is not used in the check node update process, for check node m.

Instead, a preferred embodiment of the invention updates the check nodes, in each iteration, by exploiting the contributions from bit nodes by prioritising, in terms of computational resources or complexity, for each check node j the most contributing bit node $n_0$, where $$n_0 = \underset{i' \in N(j)}{\operatorname{Arg\,min}} \{|T_{i',j}|\},$$

to update the extrinsic check node message $E_{j,n_0}$ being passed to bit node $n_0$ over the less contributory bit nodes that update the remaining extrinsic check node messages $E_{j,i}, \forall i \in N(j) \backslash n_0$.

The result is the allocation of more computational resources, complexity, and thus more accuracy to the extrinsic check node message sent by the check node to the bit node that generates less reliable edge messages, while still taking into account the contribution from other bit nodes. This can result in either similar performance with less computational complexity or improved performance with slightly more computational complexity.

Figure 7:
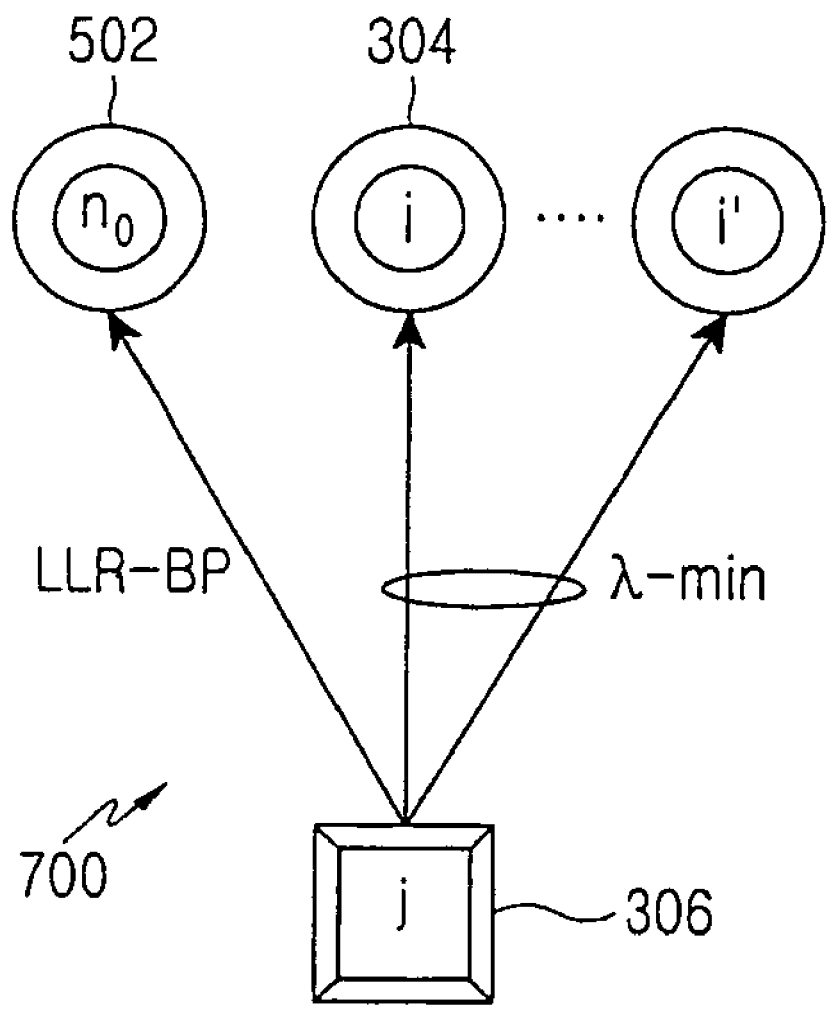
FIG. 7 illustrates an example of a preferred embodiment of the iterative decoding process using a check node update process based on the Belief Propagation and Lambda-Min algorithms.

Referring to FIG. 7, an illustration of a preferred embodiment of the invention for the check node update process 700 that uses the LLR-BP algorithm to update the check nodes 306 passing extrinsic check node messages to the least reliable bit node 502, and then use the Lambda-Min algorithm to update the check nodes 306 passing extrinsic check node messages to a subset of the remaining bit nodes $N_\lambda(j)$, in this preferred embodiment, the $\lambda$ least reliable remaining bit nodes are used. However, the preferred embodiment is not limited to using only the remaining least reliable bit nodes, other selections of the remaining bit nodes are possible.

This preferred embodiment results in the following check node update process for each check node j 306:

Identify:

(a) The least reliable bit node 502 (bit node with smallest bit node message) among N(j):

$$n_0 = \arg\min_{i \in N(j)}\{|T_{i,j}|\}$$

(b) The ($\lambda$−1) least reliable bit nodes among N(j) \ $n_0$:

$$N_\lambda(j) = \{i \in N(j) | \lambda \text{lowest} |T_{i,j}|\}$$

In the check node update process, for check node j 306, update the extrinsic check node messages as follows by selecting a first and second algorithm:

(a) For the check node message being passed to bit node $n_0$ 502 use LLR-BP algorithm as the first algorithm:

$$n_0: |E_{j,n_0}| = \Phi\left[\sum_{i' \in N(j) \setminus n_0} \Phi(|T_{i',j}|)\right]$$

(b) For check node messages being passed to the remaining bit nodes 304 use Lambda-Min algorithm as the second algorithm:

$$\forall\, i \in N(j) \setminus n_0 \quad |E_{j,i}| \approx \Phi\left[\sum_{i' \in N_\lambda(j) \setminus i} \Phi(|T_{i',j}|)\right]$$

Figure 8A:
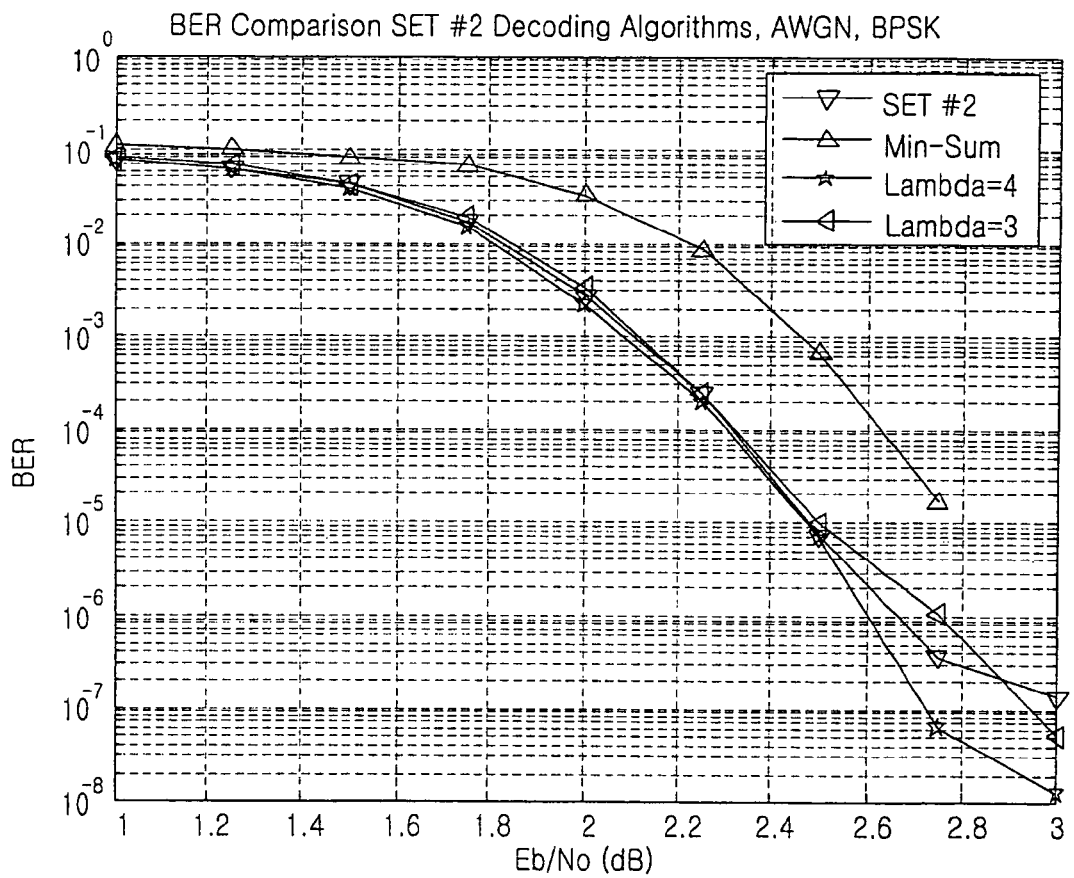
FIG. 8A illustrates simulation results depicting the bit-error-rate performance versus signal-to-noise ratio (Eb/No) for the preferred embodiment of FIG. 7.
Figure 8B:
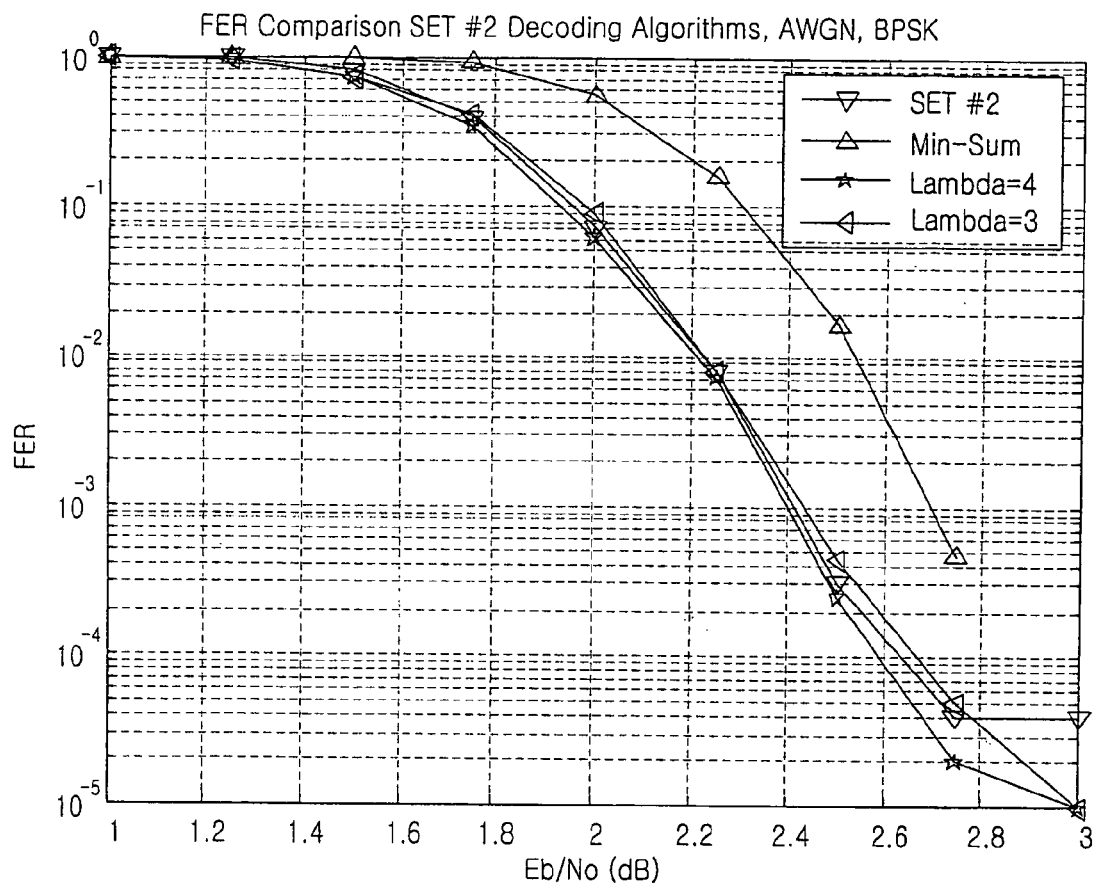
FIG. 8B illustrates simulation results depicting the frame-error-rate performance versus signal-to-noise ratio (Eb/No) for the preferred embodiment of FIG. 7.

Referring now to FIGS. 8A and 8B, a comparison of the error performance is made with respect to the reference Lambda-Min and Min-Sum algorithms and this preferred embodiment, which is labelled as SET #2. The communication system model uses the IEEE 802.16e standard and an LDPC encoder/decoder is used having an LDPC code of rate $$R_C = \frac{2}{3}$$

with a frame length of Zf=96 bits. The Lambda-Min algorithm is shown for $\lambda$=3 and 4. However, the preferred embodiment uses $\lambda$=3.

The simulated bit error rate (BER) vs SNR ($E_b/N_0$) for this system is shown in FIG. 8A and the simulated frame error rate (FER) vs SNR ($E_b/N_0$) for this system is shown in FIG. 8B.

Referring to FIG. 8A, the performance gain of the preferred embodiment is at least 0.3 dB at a BER=$10^{-4}$ over that of the Min-Sum algorithm—in fact, the performance is the same as that of Lambda-Min algorithms. For lower BER<1e-4, the performance gain is actually between both the Lambda-Min algorithms with $\lambda$=3 and 4. The advantage is that the preferred embodiment provides an intermediate solution both in terms of performance and complexity as seen from the complexity analysis in Table 1, see row labelled SET #2.

The computational complexity of the reference algorithms and this preferred embodiment is shown in Table 1. The complexity of the preferred embodiment is given in the row labelled SET#2. This is shown to be less than the complexity of the BP algorithm and closer in complexity to that of the Lambda-Min algorithms. For the same $\lambda$ used in both the preferred embodiment and the Lambda-Min algorithm, there is in fact less complexity in the number of simple operations, while only slightly more complexity in the calls to $\Phi(\cdot)$. However, as seen in the BER and FER shown in FIGS. 8A and 8B, the preferred embodiment outperforms the same $\lambda$ Lambda-Min algorithm for a given BER and FER.

The bit node update process in this preferred embodiment is the same as that of the BP algorithm.

It is clear, that this preferred embodiment allows for lower complexity decoding of LDPC codes while having a performance close to the LLR-BP algorithm. Moreover, there is more granularity in terms of complexity and performance. That is, there is a reduced gap in the performance between $\lambda$-min and ($\lambda$+1)-min of the preferred embodiment and a reduced increase in complexity, as opposed to the granularity in terms of complexity and performance between the $\lambda$-min and ($\lambda$+1)-min Lambda-Min algorithms.

This allows for the fine tuning of the complexity or gradations of computational complexity to be allocated before or during the iterative decoding process, allowing the selection of the first and second algorithms, (and other algorithms), to be used for, or if necessary adapted during, the iterative decoding process. This provides an iterative decoding process that is able to adapt to the computational requirements of the hardware/software that the LDPC decoder requires for a given communications link/channel for example, or for a given performance or quality of service.

Furthermore, the Lambda-Min algorithm for the same $\lambda$ as in the preferred embodiment requires an increased amount of storage/memory.

(3) Set #3

A further preferred embodiment of the invention updates the check nodes, in each iteration, by exploiting the contributions from bit nodes by prioritising, in terms of computational resources or complexity, the set of most contributing bit nodes $N_\lambda(j) = \{i \in N(j) | \lambda \text{lowest} |T_{i,j}|\}$, to update the extrinsic check node messages $$|E_{j,i}| \approx \Phi\left[\sum_{i' \in N_\lambda(j) \setminus i} \Phi(|T_{i,j}|)\right]$$

being passed to those bit nodes over the less contributory bit nodes to update the remaining extrinsic check node messages $E_{j,i}$, $\forall i \in N(j) \setminus N_\lambda(j)$.

The result is the allocation of more computational resources, complexity, and thus more accuracy to the extrinsic check node message sent by the check node to the bit node that generates less reliable bit node messages (i.e. the smallest magnitude bit node messages). While still taking into account the contribution from other bit nodes by selection of a second algorithm. This can result in intermediate performance with reduced computational complexity compared with the LLR-BP and Lambda-Min algorithms.

Figure 9:
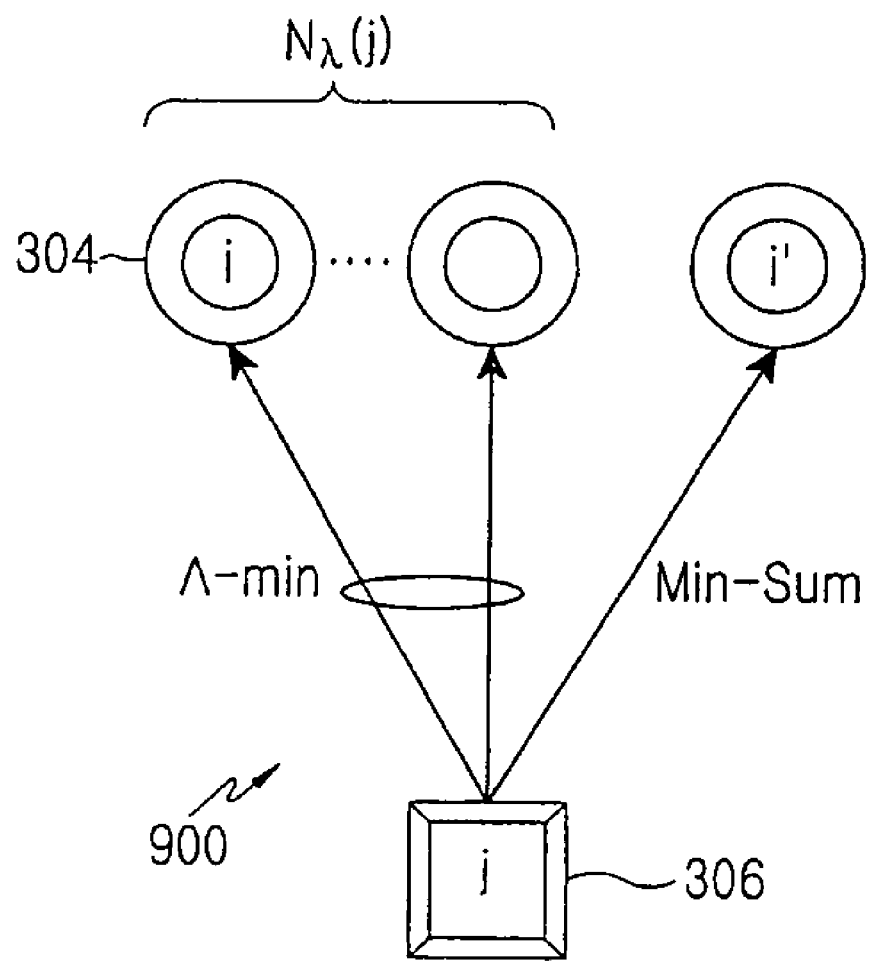
FIG. 9 illustrates an example of a preferred embodiment of the iterative decoding process using a check node update process based on the Lambda-Min and Min Sum algorithms.

Referring to FIG. 9, an illustration is shown of a preferred embodiment of the invention in which check node update process 900 uses, as the first algorithm, the Lambda-Min algorithm to update the check nodes 306 passing extrinsic check node messages to the least reliable bit nodes 304, which are the λ least reliable bit nodes. In addition, the preferred embodiment uses, as the second algorithm, the Min-Sum algorithm to update the check nodes 306 passing extrinsic check node messages to the remaining bit nodes.

This results in the following check node update process for each check node j, $1 \leq j \leq m$:

Identify:

(a) The λ least reliable bit nodes (bit nodes passing the smallest bit node messages to check node j 306) among N(j):

$$N_\lambda(j) = \{i \in N(j) | \lambda \text{ lowest} |T_{i,j}|\}$$

(b) The least reliable bit node among $N(j) \backslash N_\lambda(j)$:

$$n_0 = \underset{i' \in N(j) \backslash N_\lambda(j)}{\text{Argmin}} \{|T_{i',j}|\}$$

In the check node update process, update the extrinsic check node messages using a first and second algorithm as follows:

(a) For check nodes messages being passed to the set of bit nodes $N_\lambda(j)$ use the Lambda-Min algorithm as the first algorithm:

$$\forall i \in N_\lambda(j): |E_{j,i}| \approx \Phi\left[\sum_{i' \in N_\lambda(j) \backslash i} \Phi(|T_{i',j}|)\right]$$

(b) For check node messages being passed to the remaining bit nodes use the Min-Sum algorithm as the second algorithm:

$$\forall i \in N(j) \backslash N_\lambda(j), n_0 = \underset{i' \in N(j) \backslash N_\lambda(j)}{\text{Argmin}} \{|T_{i',j}|\}: |E_{j,i}| = \underset{i' \in N(j) \backslash i}{\min} \{|T_{i',j}|\} = |T_{n_0,j}|$$

Figure 10A:
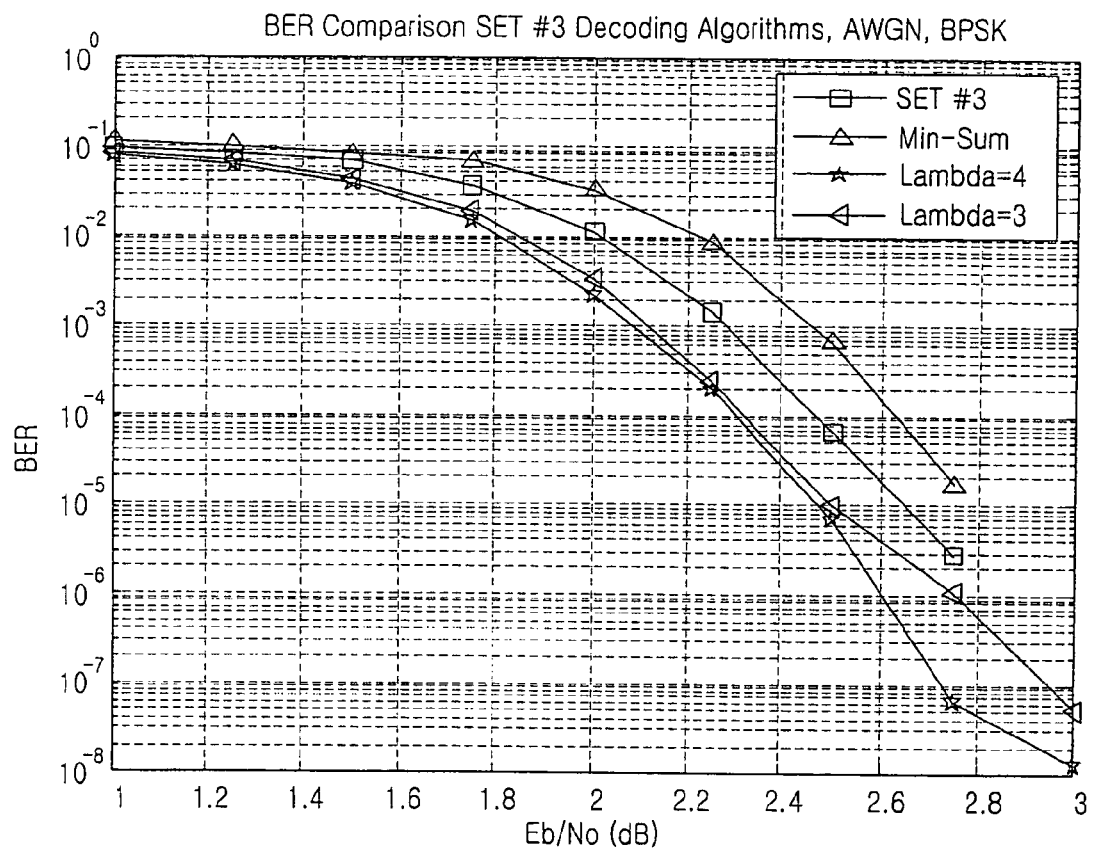
FIG. 10A illustrates simulation results depicting the bit-error-rate performance versus signal-to-noise ratio (Eb/No) for the preferred embodiment of FIG. 9.
Figure 10B:
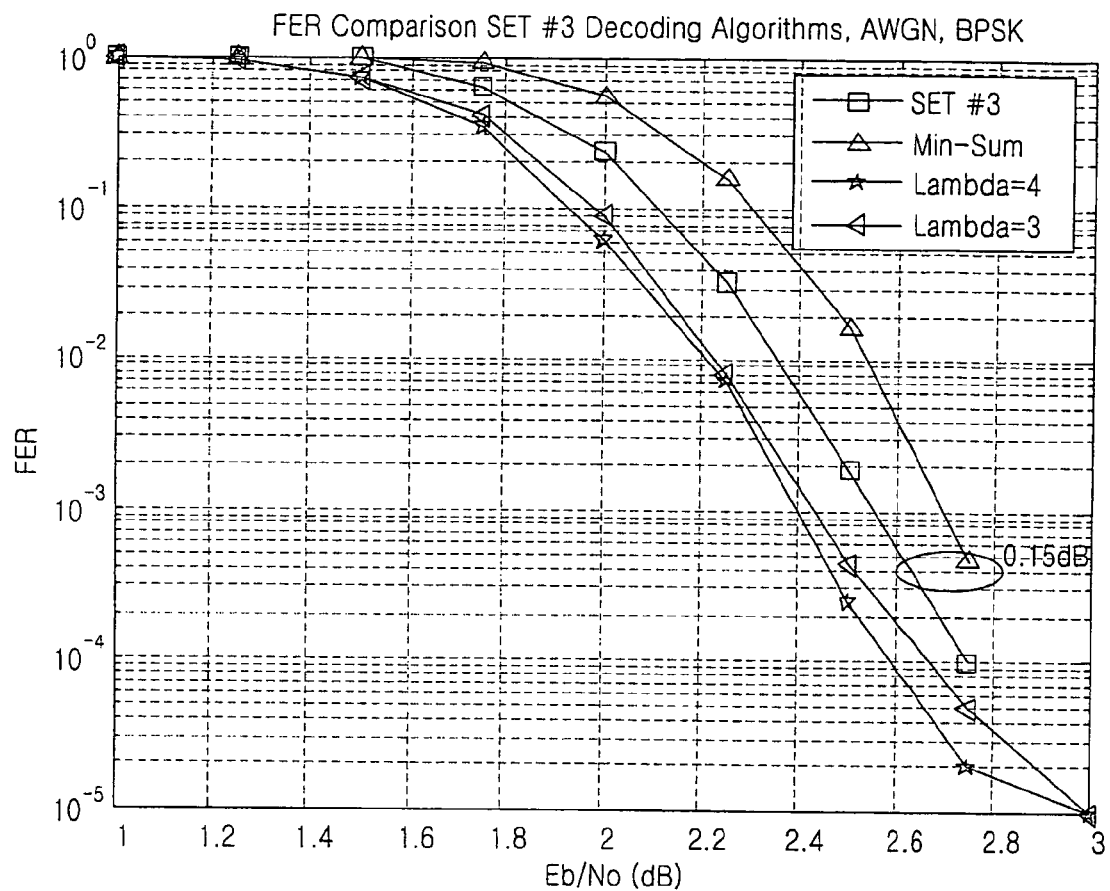
FIG. 10B illustrates simulation results depicting the frame-error-rate performance versus signal-to-noise ratio (Eb/No) for the preferred embodiment of FIG. 9.

Referring now to FIGS. 10 and 10B, a comparison of the error performance is made with respect to the reference Lambda-Min and Min-Sum algorithms and this preferred embodiment, which is labelled SET #3. The communication system model uses the IEEE 802.16e standard and an LDPC encoder/decoder having an LDPC code of rate $$R_c = \frac{2}{3}$$

with a frame length of Zf=96 bits. The Lambda-Min algorithm is shown for λ=3 and 4. The preferred embodiment uses λ=3.

The simulated BER vs SNR ($E_b/N_0$) for this system is shown in FIG. 10A and the simulated FER vs SNR ($E_b/N_0$) for this system is shown in FIG. 10B.

Referring to FIG. 10A, the performance gain of the preferred embodiment over the Min-Sum algorithm is 0.15 db for a BER of 1e-4. The performance is between that of the Min-Sum algorithm and the Lambda-Min algorithms. In addition, as the SNR increases, the performance of the preferred embodiment approaches that of the Lambda-Min algorithm for λ=3. Similar FER performance is attained as can be seen in FIG. 10B. The preferred embodiment is an intermediate solution between the full Lambda-Min and Min-Sum algorithms both in term of performance and complexity (see Table 1, for row labelled SET #3).

As can be appreciated from the foregoing description, the present invention provides a hybrid decoding scheme generated by combining two of BP algorithm, Min-Sum algorithm, and Lambda-Min algorithm, thereby maintaining a decoding performance, and reducing a decoding complexity in decoding LDPC code.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for receiving a signal in a signal reception apparatus of a communication system using a Low Density Parity Check (LDPC) code, the method comprising:
    decoding a received signal according to a hybrid decoding scheme,
    wherein decoding the received signal according to the hybrid decoding scheme comprises:
        updating a plurality of bit nodes included in the received signal; and
        updating a plurality of check nodes,
    wherein the hybrid decoding scheme is generated by combining two of a Belief Propagation algorithm, a Min-Sum algorithm, and a Lambda-Min algorithm, and
    wherein when the hybrid decoding scheme is generated by combining the Belief Propagation algorithm with the Min-Sum algorithm, updating the plurality of check nodes comprises:
        using the Belief Propagation algorithm in updating a check node message for a least reliable bit node, and
        using the Min-Sum algorithm in updating a check node message for a remaining bit node except the least reliable bit node.

2. The method of claim 1, wherein when the hybrid decoding scheme is generated by combining the Belief Propagation algorithm with the Lambda-Min algorithm, updating the plurality of check nodes comprises:
    using the Belief Propagation algorithm in updating a check node message for a least reliable bit node, and
    using the Lambda-Min algorithm in updating a check node message for a remaining bit node except the least reliable bit node.

3. The method of claim 1, wherein when the hybrid decoding scheme is generated by combining the Lambda-Min algorithm with the Min-Sum algorithm, updating the plurality of check nodes comprises:
    using the Lambda-Min algorithm in updating a check node message for λ least reliable bit node, and
    using the Min-Sum algorithm in updating a check node message for a remaining bit node except the λ least reliable bit node.

4. The method of claim 1, wherein when the hybrid decoding scheme is generated by combining the Belief Propagation algorithm with the Lambda-Min algorithm,
    updating the plurality of check nodes comprises, for each check node:
        determining a first subset of bit node messages from the set of bit node messages for use in updating each check node;

selecting the Belief Propagation algorithm for use in updating a first subset of check node messages corresponding to the first subset of bit node messages;

determining a second subset of bit node messages, excluding the first subset of bit node messages, for use in updating each check node; and selecting the Lambda-Min algorithm for updating a second subset of check node messages corresponding to the second subset of bit node messages.

5. The method of claim 4, wherein the Lambda-Min algorithm comprises:

determining the most contributing bit node message from the second subset of bit node messages; and updating the second subset of check node messages with the most contributing bit node message, wherein the Belief Propagation algorithm includes forming a summation over a combination of the first subset of bit node messages, and wherein forming the summation over the combination of the first subset of bit node messages comprises updating the first subset of check node messages, where for each check node message in the first subset of check node messages the said each check node message is updated by the summation with a contribution of the bit node message corresponds to the each check node message removed.

6. The method of claim 5, wherein each check node message in the first subset of check node messages is updated by the function having, as an operand, the summation with the contribution of the respective bit node message corresponding to each said check node message in the first subset of bit node messages removed.

7. The method of claim 6, wherein the Lambda-Min algorithm further comprises:

forming a summation over a combination of the reduced subset of one or more most contributing bit node messages; and updating the second subset of check node messages, where for each check node message in the second subset of check node messages the each check node message is updated by the summation with a contribution of the reduced subset of bit node messages.

8. The method of claim 7, wherein the combination of reduced subset of bit node messages is formed by a second function having, as an operand, each bit node message in the reduced subset of bit node messages.

9. The method of claim 8, wherein for each check node message in the second subset of check node messages the said each check node message is updated by the function having, as an operand, the summation with the contribution of the reduced subset of bit node messages.

10. An apparatus for receiving a signal in a communication system using a Low Density Parity Check (LDPC) code, the apparatus comprising:

a decoder for decoding a received signal according to a hybrid decoding scheme by updating a plurality of bit nodes and a plurality of check nodes, wherein the hybrid decoding scheme is generated by combining two of a Belief Propagation algorithm, a Min-Sum algorithm, and a Lambda-Min algorithm, wherein when the hybrid decoding scheme is generated by combining the Belief Propagation algorithm with the Min-Sum algorithm, the decoder uses the Belief Propagation algorithm in updating a check node message for a least reliable bit node, and uses the Min-Sum algorithm in updating a check node message for a remaining bit node except the least reliable bit node.

11. The apparatus of claim 10, wherein when the hybrid decoding scheme is generated by combining the Belief Propagation algorithm with the Lambda-Min algorithm, the decoder uses the Belief Propagation algorithm in updating a check node message for a least reliable bit node, and uses the Lambda-Min algorithm in updating a check node message for a remaining bit node except the least reliable bit node.

12. The apparatus of claim 10, wherein when the hybrid decoding scheme is generated by combining the Lambda-Min algorithm with the Min-Sum algorithm, the decoder uses the Lambda-Min algorithm in updating a check node message for $\lambda$ least reliable bit node, and uses the Min-Sum algorithm in updating a check node message for a remaining bit node except the $\lambda$ least reliable bit node.

13. The apparatus of claim 10, wherein when the hybrid decoding scheme is generated by combining the Belief Propagation algorithm with the Lambda-Min algorithm, the iterative LDPC decoder, for each check node, determines a first subset of bit node messages from the set of bit node messages for use in updating each check node by:

selecting the Belief Propagation algorithm for use in updating a first subset of check node messages corresponding to the first subset of bit node messages;

determining a second subset of bit node messages, excluding the first subset of bit node messages, for use in updating each check node; and selecting the Lambda-Min algorithm for updating a second subset of check node messages corresponding to the second subset of bit node messages.

14. The apparatus of claim 13, wherein the Lambda-Min algorithm determines the most contributing bit node message from the second subset of bit node messages, and updates the second subset of check node messages with the most contributing bit node message, and wherein the Belief Propagation algorithm forms a summation over a combination of the first subset of bit node messages, and updates the first subset of check node messages, where for each check node message in the first subset of check node messages the said each check node message is updated by the summation with a contribution of the bit node message corresponds to the each check node message removed.

15. The apparatus of claim 14, wherein each check node message in the first subset of check node messages is updated by the function having, as an operand, the summation with the contribution of the respective bit node message corresponding to each said check node message in the first subset of bit node messages removed.

16. The apparatus of claim 15, wherein the Lambda-Min algorithm forms a summation over a combination of the reduced subset of one or more most contributing bit node messages, and updates the second subset of check node messages, where for each check node message in the second subset of check node messages the each check node message is updated by the summation with a contribution of the reduced subset of bit node messages.

17. The apparatus of claim 16, wherein the combination of reduced subset of bit node messages is formed by a second function having, as an operand, each bit node message in the reduced subset of bit node messages.

18. The apparatus of claim 17, wherein for each check node message in the second subset of check node messages the said each check node message is updated by the function having, as an operand, the summation with the contribution of the reduced subset of bit node messages.

* * * * *